(12) United States Patent
Shibuta

(10) Patent No.: US 11,335,722 B2
(45) Date of Patent: May 17, 2022

(54) SOLID-STATE IMAGING DEVICE AND ELECTRONIC APPARATUS

(71) Applicant: SONY CORPORATION, Tokyo (JP)

(72) Inventor: Hirokazu Shibuta, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 525 days.

(21) Appl. No.: 16/086,173

(22) PCT Filed: Feb. 22, 2017

(86) PCT No.: PCT/JP2017/006448
§ 371 (c)(1),
(2) Date: Sep. 18, 2018

(87) PCT Pub. No.: WO2017/169314
PCT Pub. Date: Oct. 5, 2017

(65) Prior Publication Data
US 2020/0303432 A1  Sep. 24, 2020

(30) Foreign Application Priority Data

Mar. 31, 2016 (JP) .............................. JP2016-073445

(51) Int. Cl.
*H01L 27/146* (2006.01)
*H04N 5/369* (2011.01)

(52) U.S. Cl.
CPC .... *H01L 27/1464* (2013.01); *H01L 27/14621* (2013.01); *H01L 27/14627* (2013.01);
(Continued)

(58) Field of Classification Search
CPC ........... H01L 27/1464; H01L 27/14621; H01L 27/14627; H01L 27/14636; H01L 27/14645; H01L 27/14629; H01L 27/307; H01L 27/14647; H01L 27/14665–1467; H01L 27/14643–14665; H04N 5/369; G02B 6/00
See application file for complete search history.

(56) References Cited

U.S. PATENT DOCUMENTS

2010/0123811 A1  5/2010  Abe
2014/0077324 A1  3/2014  Matsugai
(Continued)

FOREIGN PATENT DOCUMENTS

JP   2008-091744   4/2008
JP   2010-141280   6/2010
(Continued)

OTHER PUBLICATIONS

Extended European Seach Report for European Patent Application No. 17773861.4, dated Feb. 22, 2019, 6 pages.
(Continued)

*Primary Examiner* — Tucker J Wright
(74) *Attorney, Agent, or Firm* — Sheridan Ross P.C.

(57) ABSTRACT

To provide a back-illuminated solid-state imaging device that can improve image quality. Provided is a back-illuminated solid-state imaging device that includes at least a semiconductor substrate, an organic photoelectric conversion film, and an optical waveguide. The organic photoelectric conversion film is formed on one of front and back surfaces of the semiconductor substrate. The optical waveguide is formed between the semiconductor substrate and the organic photoelectric conversion film.

14 Claims, 11 Drawing Sheets

(52) U.S. Cl.
CPC .. *H01L 27/14636* (2013.01); *H01L 27/14645* (2013.01); *H04N 5/369* (2013.01)

(56) References Cited

U.S. PATENT DOCUMENTS

| | | |
|---|---|---|
| 2015/0244958 A1 | 8/2015 | Ohguro et al. |
| 2016/0133865 A1 | 5/2016 | Yamaguchi |

FOREIGN PATENT DOCUMENTS

| | | |
|---|---|---|
| JP | 2012-084873 | 4/2012 |
| JP | 2013-055252 | 3/2013 |
| JP | 2014-078673 | 5/2014 |
| JP | 2014-154834 | 8/2014 |
| JP | 2015-050331 | 3/2015 |
| JP | 2015-162562 | 9/2015 |
| JP | 2015-179836 | 10/2015 |

OTHER PUBLICATIONS

Official Action (with English translation) for Japanese Patent Application No. 2018-508587, dated Sep. 15, 2020, 12 pages.
International Search Report prepared by the Japan Patent Office dated Mar. 23, 2017, for International Application No. PCT/JP2017/006448.

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2017/006448 having an international filing date of 22 Feb. 2017, which designated the United States, which PCT application claimed the benefit of Japanese Patent Application No. 2016-073445 filed 31 Mar. 2016, the entire disclosures of each of which are incorporated herein by reference.

TECHNICAL FIELD

The present technology relates to a solid-state imaging device and an electronic apparatus.

BACKGROUND ART

In general, CMOS (Complementary Metal Oxide Semiconductor) image sensor, CCD (Charge Coupled Device) and other solid-state imaging devices have found wide application in digital still camera, digital video camera, and so on.

Recent years have witnessed wide-ranging development efforts to downsize solid-state imaging devices and improve their image qualities.

For example, an imaging apparatus has been proposed that includes a first imaging device, a second imaging device, and a micro-lens array. The first imaging device generates a first photoelectric conversion signal by converting incident light on a front surface of a semiconductor substrate into an electric charge and outputs the first photoelectric conversion signal via an interconnect layer formed on the front surface of the semiconductor substrate. The second imaging device is stacked over the front surface of the semiconductor substrate, generates a second photoelectric conversion signal by converting infrared light using an organic photoelectric conversion film that absorbs infrared light and transmits visible light, and outputs the second photoelectric conversion signal via the interconnect layer. The micro-lens array is stacked on a side of the second imaging device opposite to the first imaging device and has a plurality of micro-lenses disposed in a two-dimensional manner.

The first imaging device has a plurality of first pixels that are provided to correspond to the respective micro-lenses and that output the first photoelectric conversion signals. The second imaging device has a plurality of second pixels that are provided to correspond to the respective micro-lenses and that output the second photoelectric conversion signals. The second pixels are focus detection pixels that output a focus detection signal for detecting a focal adjustment state of an image forming optics through a pupil division phase difference scheme. An optical waveguide is formed between the second imaging device and the first imaging device to guide visible light that has transmitted through the second pixels of the second imaging device onto the first pixels of the first imaging device (refer to PTL 1).

According to the technology proposed in PTL 1, an optical waveguide is formed between the first and second imaging devices.

CITATION LIST

Patent Literature

[PTL 1]
JP 2015-162562A

SUMMARY

Technical Problem

However, the technology proposed in PTL 1 is a so-called front-illuminated imaging device that has an optical waveguide formed (stacked) at the same position (in the same layer) as an interconnect layer, possibly resulting in degraded image quality and making it impossible to improve the image quality.

The present technology has been devised in light of such circumstances, and it is an object of the present disclosure to provide a back-illuminated solid-state imaging device that can improve image quality and an electronic apparatus incorporating a back-illuminated solid-state imaging device.

Solution to Problem

As a result of earnest efforts to solve the above object, the present inventor et al. succeeded in dramatically improving the image quality by forming an optical waveguide between a semiconductor substrate and an organic photoelectric conversion film, thereby completing the present technology.

That is, the present technology first provides a back-illuminated solid-state imaging device that includes at least a semiconductor substrate, an organic photoelectric conversion film, and an optical waveguide. The organic photoelectric conversion film is formed on one of front and back surfaces of the semiconductor substrate. The optical waveguide is formed between the semiconductor substrate and the organic photoelectric conversion film.

The solid-state imaging device may include a lower electrode and a through electrode. The lower electrode is provided under the organic photoelectric conversion film. The through electrode penetrates the semiconductor substrate to transfer an electric charge, converted through photoelectric conversion of the organic photoelectric conversion film, to the side of the other of the front and back surfaces of the semiconductor substrate. The lower electrode and the through electrode may be connected.

Also, the solid-state imaging device may include a lower electrode, a through electrode, and at least an interconnect layer. The lower electrode is provided under the organic photoelectric conversion film. The through electrode penetrates the semiconductor substrate to transfer an electric charge, converted through photoelectric conversion of the organic photoelectric conversion film, to the side of the other of the front and back surfaces of the semiconductor substrate. The interconnect layer connects the lower electrode and the through electrode The semiconductor substrate may include a first photodiode so that at least part of incident light not converted into an electric charge by the organic photoelectric conversion film is converted into an electric charge by the first photodiode.

The semiconductor substrate may include a second photodiode so that the second photodiode is provided between the first photodiode and the other of the front and back surfaces of the semiconductor substrate and so that at least part of incident light not converted into an electric charge by the organic photoelectric conversion film and the first photodiode is converted into an electric charge by the second photodiode.

The solid-state imaging device may further include a first insulating film formed between the semiconductor substrate and the organic photoelectric conversion film.

Also, the optical waveguide and the first insulating film may be perpendicularly separated.

Further, the optical waveguide may have a refractive index greater than the first insulating film.

Still further, the optical waveguide may include SiN and have a refractive index of 1.8 to 2.1, and the first insulating film may include SiO and have a refractive index of 1.3 to 1.5.

The optical waveguide may include a low-dielectric constant material.

Also, the number of vertical spectroscopic layers may be two or three.

Further, the thickness from the semiconductor substrate to the organic photoelectric conversion film may be 1 μm or less.

Still further, the optical waveguide may include an organic film.

Also, the solid-state imaging device may further include a second insulating film formed under the optical waveguide.

Further, the solid-state imaging device may further include a low-dielectric-constant material layer formed under the optical waveguide.

Still further, the solid-state imaging device may further include an inner lens formed between the organic photoelectric conversion film and the optical waveguide.

The solid-state imaging device may further include a first lower electrode, a second lower electrode, a via, and a photodiode. The second lower electrode is connected to the first lower electrode and formed at a lower position than the first lower electrode. The via connects the first lower electrode and the second lower electrode. The photodiode is formed at a lower position than the second lower electrode. A first distance between the center of the photodiode and the center of the via at a view angle center and a second distance between the center of the photodiode and the center of the via at a view angle end may be different.

Also, the present technology provides an electronic apparatus incorporating a back-illuminated solid-state imaging device that includes at least a semiconductor substrate, an organic photoelectric conversion film, and an optical waveguide. The organic photoelectric conversion film is formed on one of front and back surfaces of the semiconductor substrate. The optical waveguide is formed between the semiconductor substrate and the organic photoelectric conversion film.

Advantageous Effect of Invention

According to the present technology, it is possible to improve image quality. It should be noted that the effect described herein is not necessarily limited and may be any one of the effects described in this technology.

DESCRIPTION OF EMBODIMENTS

Figure 1:
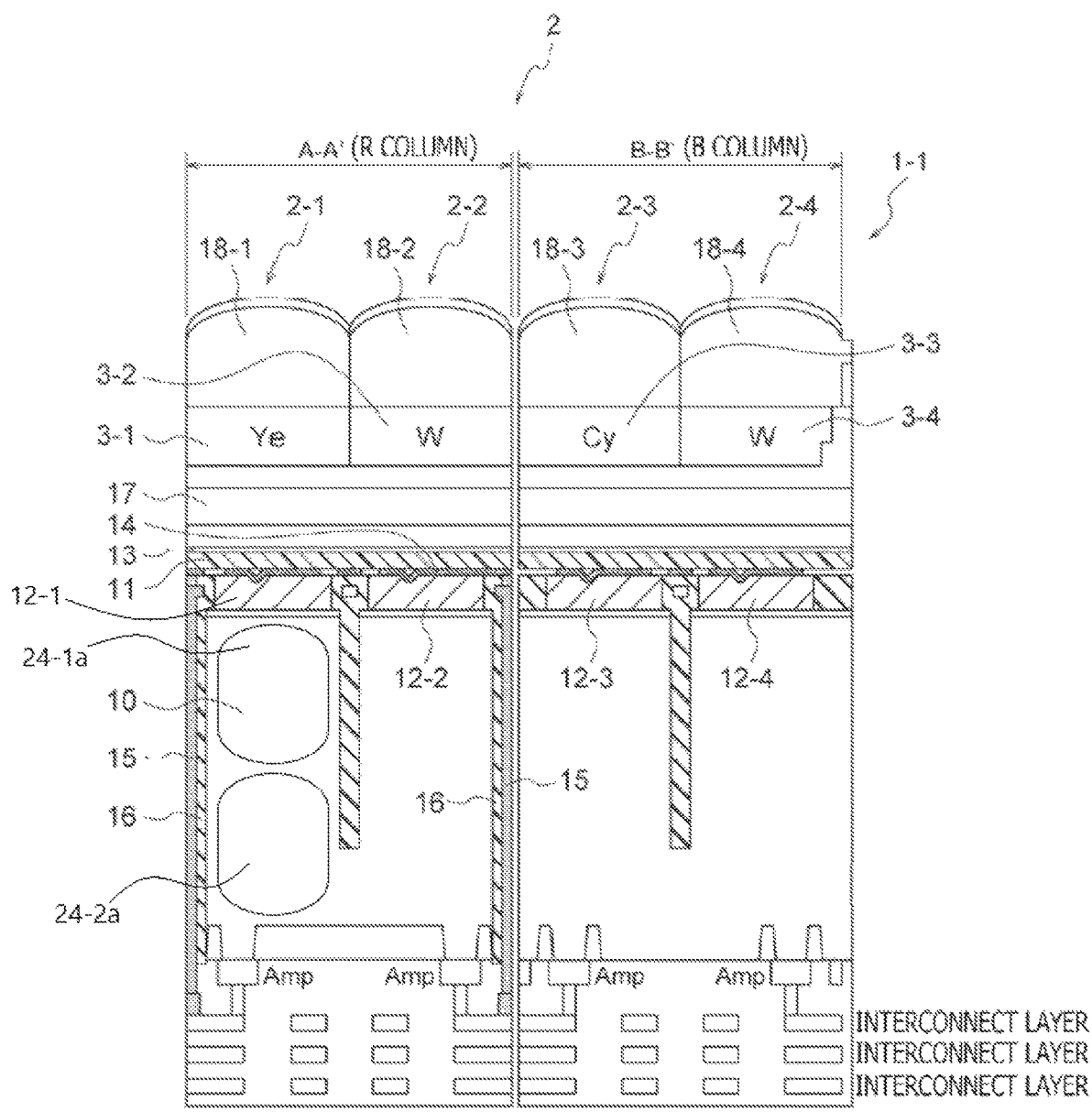
FIG. 1 is a cross-sectional view illustrating a configuration example of a back-illuminated solid-state imaging device of a first embodiment to which the present technology is applied.

A description will be given below of preferred modes for carrying out the present technology. Embodiments described below illustrate examples of typical embodiments of the present technology, and the present technology is not to be construed narrower in scope by this.

It should be noted that the description will be given in the following order:
1. First embodiment (back-illuminated solid-state imaging device)
2. Second embodiment (back-illuminated solid-state imaging device)
3. Third embodiment (back-illuminated solid-state imaging device)
4. Fourth embodiment (back-illuminated solid-state imaging device)
5. Fifth embodiment (back-illuminated solid-state imaging device)
6. Sixth embodiment (electronic apparatus)
7. Usage examples of the back-illuminated solid-state imaging devices to which the present technology is applied

1. First Embodiment (Back-Illuminated Solid-State Imaging Device)

A back-illuminated solid-state imaging device of a first embodiment according to the present technology includes at least a semiconductor substrate, an organic photoelectric conversion film, and an optical waveguide. The organic photoelectric conversion film is formed on one of front and back surfaces of the semiconductor substrate. The optical waveguide is formed between the semiconductor substrate and the organic photoelectric conversion film.

FIGS. 1 to 8 illustrate a back-illuminated solid-state imaging device 1 (solid-state imaging device 1-1 in FIGS. 1 to 8) of the first embodiment according to the present technology.

The solid-state imaging device 1-1 includes at least a semiconductor substrate 10, an organic photoelectric conversion film 11, and an optical waveguide 12. The organic photoelectric conversion film 11 is formed on one of front and back surfaces of the semiconductor substrate 10. The optical waveguide 12 is formed between the semiconductor substrate 10 and the organic photoelectric conversion film 11.

The solid-state imaging device 1-1 further includes a first insulating film 16 (16-1), and the optical waveguide 12 and the first insulating film 16-1 are perpendicularly (vertically in FIG. 1) separated. An insulating dielectric such as silicon oxide film or TEOS can be used, for example, as the first insulating film 16-1.

Figure 2:
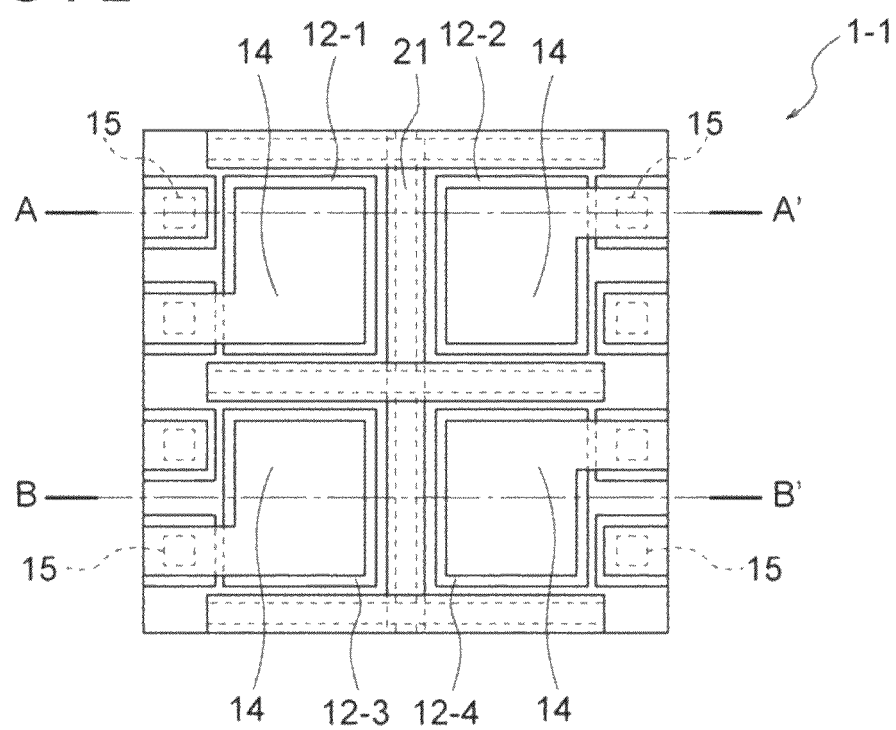
FIG. 2 is a plan view illustrating a configuration example of the back-illuminated solid-state imaging device of the first embodiment to which the present technology is applied.

FIG. 1 is a diagram depicting, horizontally side by side, a cross-sectional view (A-A' (R column)) cutting through a back-illuminated solid-state imaging device 1-1 illustrated in the plan view of FIG. 2 as seen from a light incidence side along line A-A' and a cross-sectional view (B-B' (B column)) cutting through the back-illuminated solid-state imaging device 1-1 along line B-B' and depicts four pixels 2 (pixels 2-1 to 2-4) of the solid-state imaging device 1-1.

Figure 3:
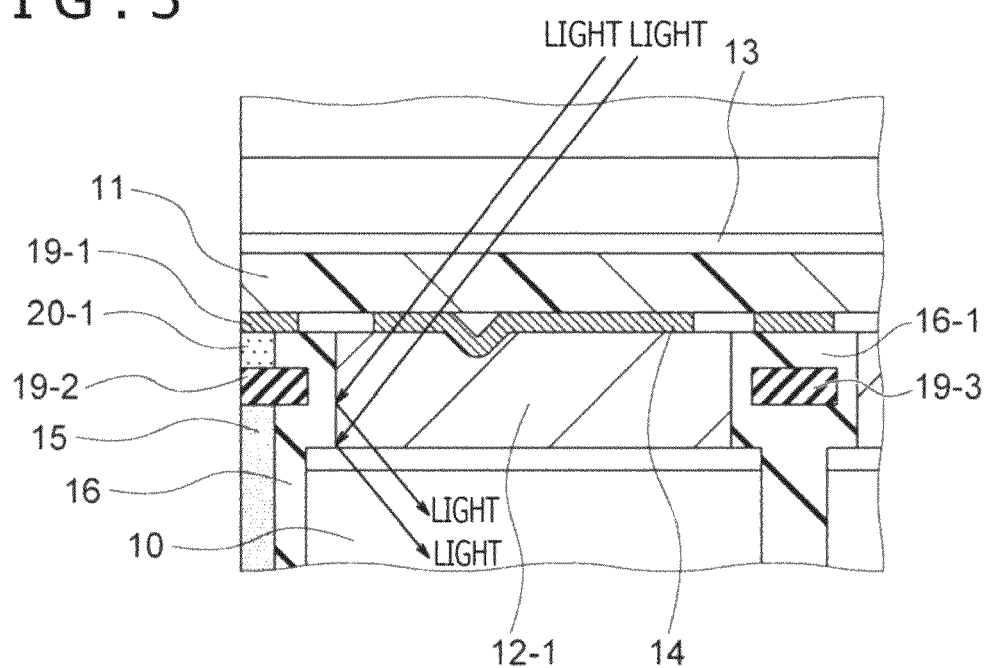
FIG. 3 is a diagram for describing an optical waveguide.

FIG. 3 is a partially enlarged view of FIG. 1 and is a diagram for describing the optical waveguide 12. The optical waveguide 12 can reflect incident light entering an imaging surface at various angles with an interface between the optical waveguide 12 and the first insulating film 16-1 by taking advantage of the difference in refractive index between the optical waveguide 12 and the first insulating film 16-1. Therefore, the optical waveguide 12 can prevent entry of light into adjacent pixels.

Formation of the optical waveguide 12 on the back-illuminated solid-state imaging device 1-1 of the first embodiment according to the present technology prevents entry of light into adjacent pixels as described above by the reflection by the interface between the optical waveguide 12 and the first insulating film 16-1, providing an effect of enhancing image quality, and in particular, an effect of improving sensitivity, shading, and color mixing. If the distance between the semiconductor substrate 10 and the organic photoelectric conversion film 11 is increased, conventional solid-state imaging devices using an organic photoelectric conversion film become prone to color mixing and shading, for example, in the case where incident light enters pixels diagonally. For this reason, conventional solid-state imaging devices preferably reduce the distance between the semiconductor substrate 10 and the organic photoelectric conversion film 11 from the viewpoint of reducing color mixing and shading. With conventional solid-state imaging devices using an organic photoelectric conversion film, on the other hand, if the distance between the semiconductor substrate 10 and the organic photoelectric conversion film 11 is reduced, parasitic capacitance that appears in the lower electrode that reads out a signal charge from the organic photoelectric conversion film will increase. Increase in this parasitic capacitance causes the signal acquired during readout of a signal charge from the organic photoelectric conversion film 11 to decrease. This leads to a reduced signal-to-noise ratio (S/N ratio) of the signal read out from the organic photoelectric conversion film for conventional solid-state imaging devices. In contrast, the back-illuminated solid-state imaging device 1-1 of the first embodiment has the optical waveguide 12 formed between the semiconductor substrate 10 and the organic photoelectric conversion film 11. This provides an effect of improving sensitivity, shading, and color mixing, eliminating the need to reduce the thickness from the semiconductor substrate 10 to the organic photoelectric conversion film 11, which means that the thickness can be increased. Then, by increasing the thickness from the semiconductor substrate 10 to the organic photoelectric conversion film 11, it is possible to reduce the capacitance between the semiconductor substrate 10 and a lower electrode 14 for the organic photoelectric conversion film 11, possibly preventing decline in conversion efficiency and aggravation of random noise (RN).

Further, by introducing the optical waveguide 12 to the back-illuminated solid-state imaging device 1-1 of the first embodiment according to the present technology, the back-illuminated solid-state imaging device 1-1 of the first embodiment according to the present technology can strike a balance between the effect of improving sensitivity, shading, and color mixing and an effect of preventing the decline in conversion efficiency and the aggravation of random noise (RN).

Figure 4:
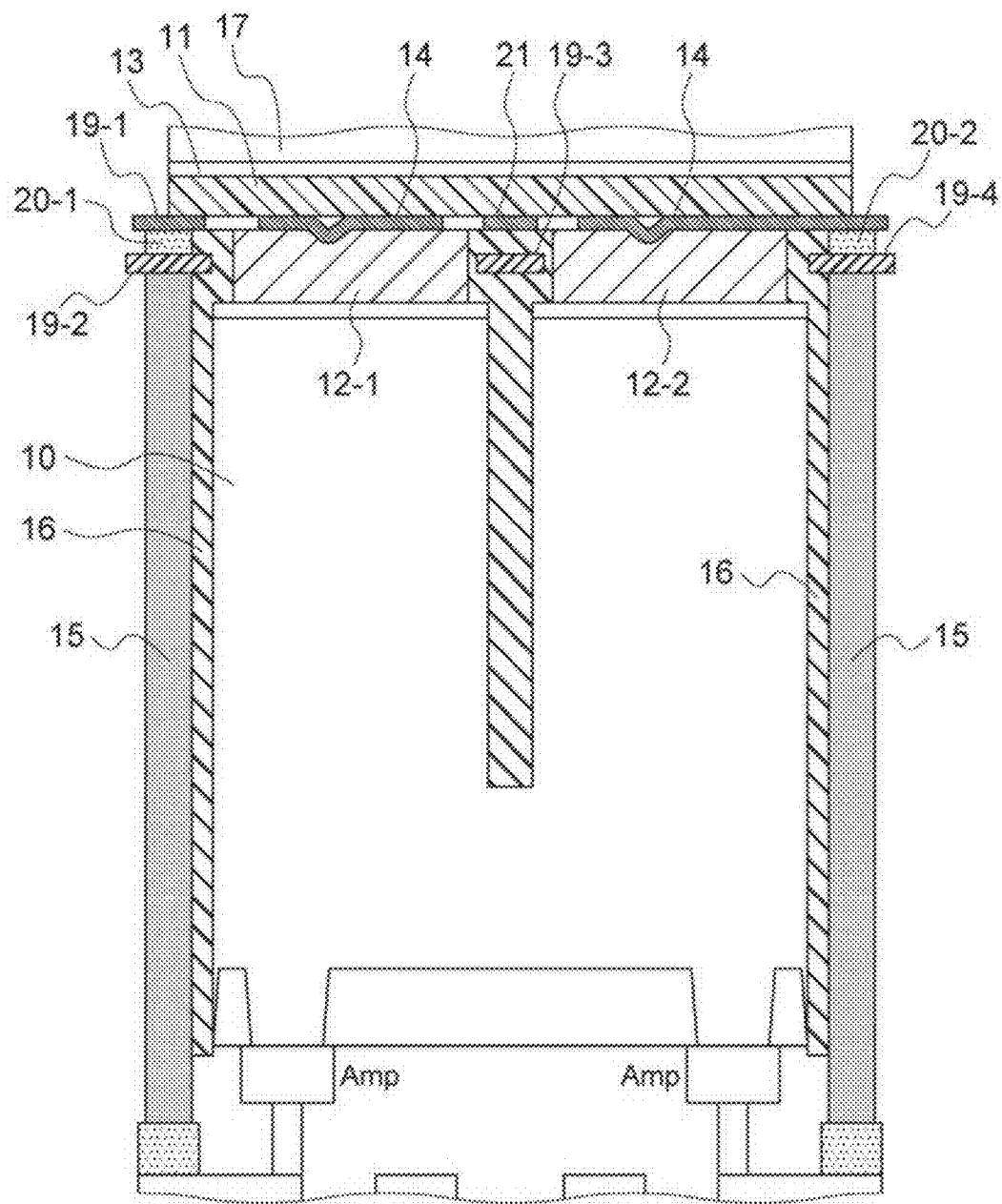
FIG. 4 is a partially enlarged view of FIG. 1.
Figure 5:
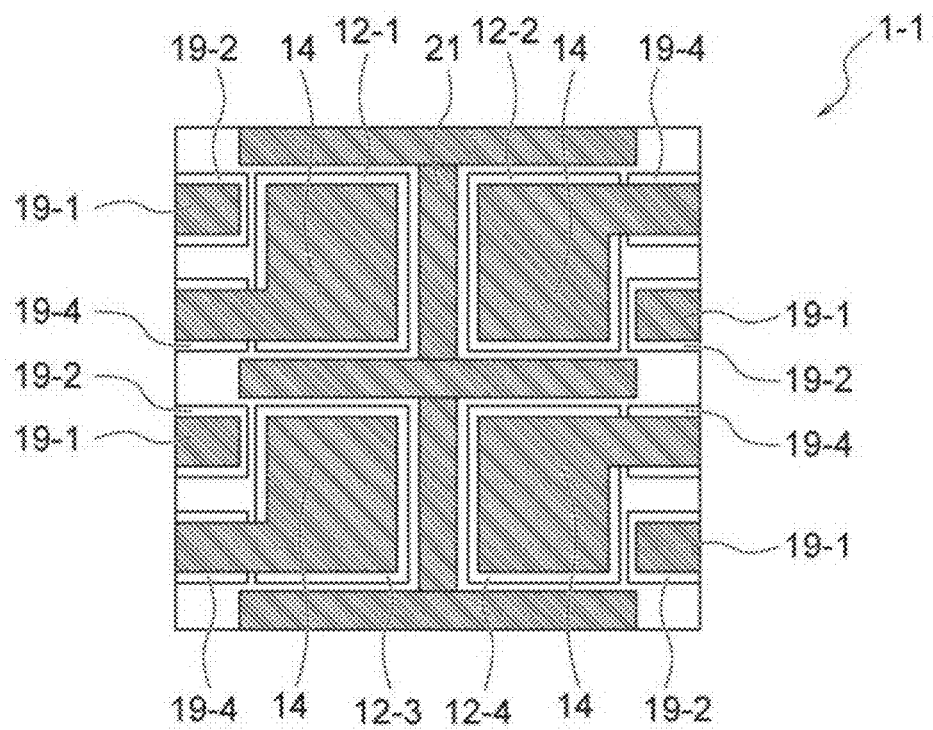
FIG. 5 is a plan view illustrating a configuration example of the back-illuminated solid-state imaging device of the first embodiment to which the present technology is applied.
Figure 6:
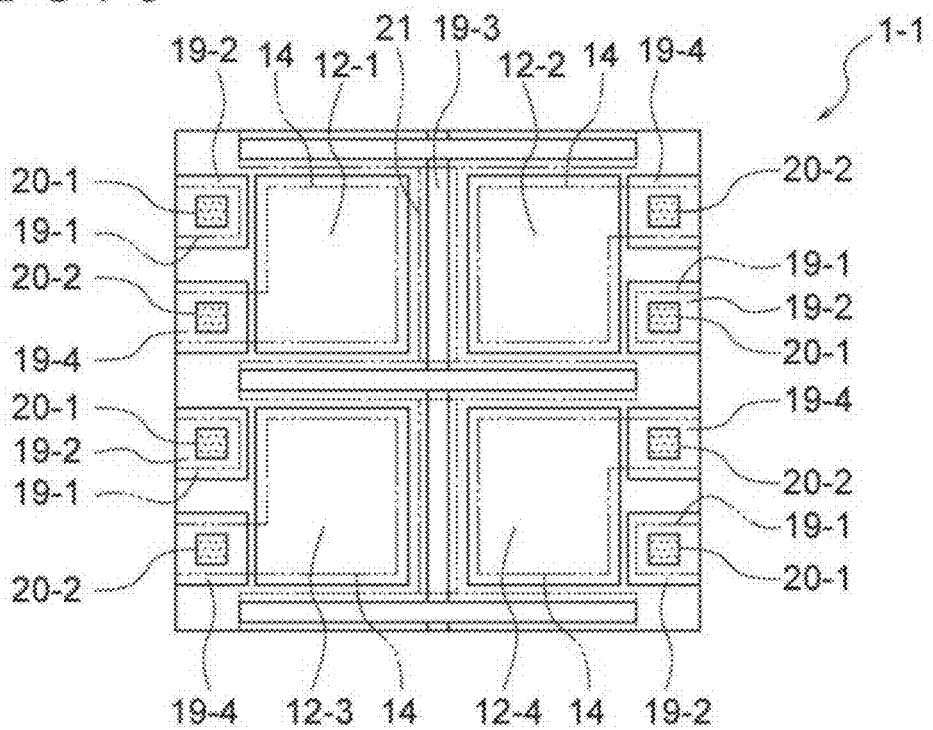
FIG. 6 is a plan view illustrating a configuration example of the back-illuminated solid-state imaging device of the first embodiment to which the present technology is applied.
Figure 7:
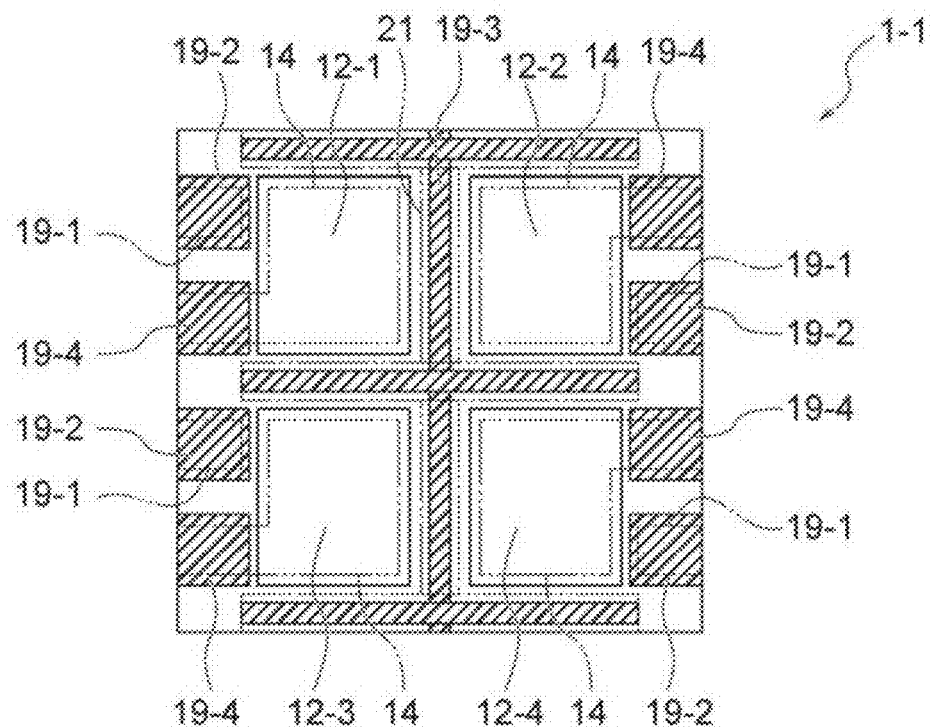
FIG. 7 is a plan view illustrating a configuration example of the back-illuminated solid-state imaging device of the first embodiment to which the present technology is applied.
Figure 8:
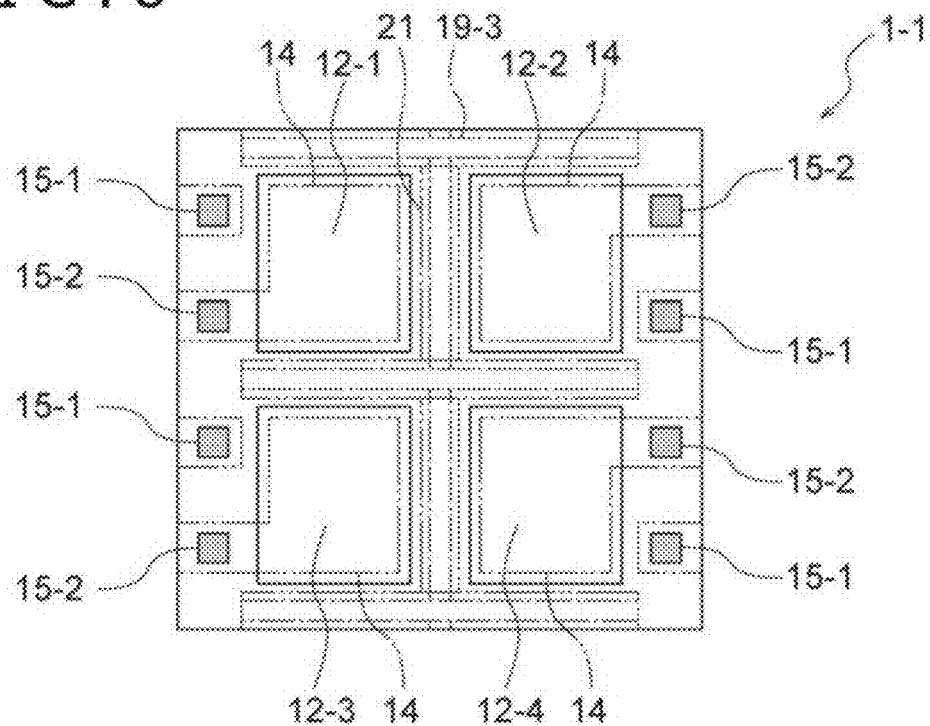
FIG. 8 is a plan view illustrating a configuration example of the back-illuminated solid-state imaging device of the first embodiment to which the present technology is applied.

FIG. 4 is an enlarged view of the cross-sectional view (A-A' (R column)) that cuts along line A-A' illustrated at left in FIG. 1. FIG. 5 is a diagram illustrating a plan layout of four pixels of the solid-state imaging device 1-1 for the lower electrode 14, a shield electrode 21, and an interconnect layer 19-1 that are the same layer illustrated in FIG. 4. FIG. 6 is a diagram illustrating a plan layout of four pixels of the solid-state imaging device 1-1 for a via 20-1 and a via 20-2 that are the same layer. FIG. 7 is a diagram illustrating a plan layout of four pixels of the solid-state imaging device 1-1 for an interconnect layer 19-2 and an interconnect layer 19-4 that are the same layer. FIG. 8 is a diagram illustrating a plan layout of four pixels of the solid-state imaging device 1-1 for upper portions of through electrodes 15 on the left and upper portions of the through electrodes on the right illustrated in FIG. 4 (where the upper portions of the through electrode 15 on the left and the upper portions of the through electrode on the right are at the same height). In FIG. 4 and FIGS. 5 through 8, the same components are denoted by the same reference numerals.

Referring to FIGS. 4 to 8, the solid-state imaging device 1-1 includes the lower electrode 14, the through electrode 15 (through electrode on the right in FIG. 2), and the interconnect layer 19-4. The lower electrode 14 is provided under the organic photoelectric conversion film 11. The through electrode 15 penetrates the semiconductor substrate 10 to transfer an electric charge, converted through photoelectric conversion of the organic photoelectric conversion film 11, to the side of the other of the front and back surfaces of the semiconductor substrate 10. The interconnect layer 19-4 connects the lower electrode 14 and the through electrode 15. The interconnect layer 19-4 and the lower electrode 14 are connected via the via 20-2. The lower electrode 14 and the through electrode 15 (through electrode on the right in FIG. 2) are connected by the single interconnect layer 19-4. The interconnect layer 19-4 may be used as an interconnect for pupil correction which will be described later (second lower electrode), and in that case, the interconnect layer 19-4 may be extended in proportion to an amount of pupil correction. The lower electrode 14, the via 20-2, and the interconnect layer 19-4 may be, for example, transparent conductive films such as indium tin oxide films or indium zinc oxide films. Also, the through electrodes 15 (through electrodes on the right in FIG. 2), the interconnect layer 19-4, the via 20-2, and the lower electrode 14 can be formed by a sputtering technique or a chemical vapor deposition (CVD) technique.

The through electrodes 15 (through electrodes on the right in FIG. 2) may include a conductor having a constant diameter, and, in addition to a doped silicon material such as PDAS (Phosphorus Doped amorphous Silicon), a metallic material such as aluminum, tungsten, titanium, cobalt, hafnium, or tantalum can be employed as a conductor.

The lower electrodes 14 and the through electrodes 15 (through electrodes on the right in FIG. 2) may be connected by a plurality of interconnect layers. By connecting the lower electrodes 14 and the through electrodes 15 (through electrodes on the right in FIG. 2) with a single or a plurality of interconnect layers, it is possible to increase the thickness from the semiconductor substrate 10 to the organic photoelectric conversion film 11 and move the lower electrode 14 away from the semiconductor substrate 10, thereby reducing the capacitance to ground and preventing decline in conversion efficiency and aggravation of random noise (RN). The increased thickness from the semiconductor substrate 10 to the organic photoelectric conversion film 11 can prevent entry of light into adjacent pixels by the optical waveguide 12, improving sensitivity, shading, and color mixing. In particular, it is possible to strike a balance between the effect of improving sensitivity, shading, and color mixing and the effect of preventing the decline in conversion efficiency and the aggravation of random noise (RN).

It should be noted that, in the solid-state imaging device 1 of the first embodiment, a pixel array is formed by arranging a plurality of four-pixel units, each of which is a repeating unit, depicted in FIG. 2 two-dimensionally in row and column directions while at the same time causing the through electrodes 15 depicted in FIG. 4 to overlap as an overlap width. For this reason, the through electrode 15 depicted on line A-A' on the left in FIG. 2 is a through electrode connected to the lower electrode 14 of the top right pixel in a different four-pixel unit arranged on the left in FIG. 2 in the pixel array. Similarly, the through electrode 15, the interconnect layer 19-2, the via 20-1, and the interconnect layer 19-1 on the left in FIG. 4 are connected to the lower electrode 14 of a different pixel arranged on the left in FIG. 4.

The shield electrode 21 is formed in the same layer as the lower electrode 14 and the interconnect layer 19-1 and is a transparent electrode. An interconnect layer 19-3 is formed in the same layer as the interconnect layer 19-2 and the interconnect layer 19-4. The interconnect layer 19-3 includes a metallic material and has an effect of shielding light between pixels. The interconnect layer 19-3 may be an interconnect for emitting a signal from the shield electrode 21.

The solid-state imaging device 1-1 may include the lower electrodes 14 and the through electrodes 15 so that the lower electrodes 14 and the through electrodes 15 (through electrodes on the right in FIG. 2) are connected. The lower electrodes 14 are provided under the organic photoelectric conversion film 11. The through electrodes 15 penetrate the semiconductor substrate 10 to transfer an electric charge, converted through photoelectric conversion of the organic photoelectric conversion film 11, to the side of the other of the front and back surfaces of the semiconductor substrate 10. In this case, the lower electrodes 14 and the through electrodes 15 (through electrodes on the right in FIG. 2) are connected directly without connection via an interconnect layer.

It is possible to reduce the capacitance to ground and prevent decline in conversion efficiency and aggravation of random noise (RN) by extending the through electrodes 15 (through electrodes on the right in FIG. 2) toward the organic photoelectric conversion film 11 (upward in FIG. 2), increasing the thickness from the semiconductor substrate 10 to the organic photoelectric conversion film 11, and moving the lower electrode 14 away from the semiconductor substrate 10.

In the pixels 2 (2-1 to 2-4) illustrated in FIG. 1, photodiodes (not depicted) and electric charge holding sections (not depicted) are formed in the semiconductor substrate 10 and embedded in a silicon (Si) layer of the semiconductor substrate 10. Also, the optical waveguides 12 (12-1 to 12-4) and the organic photoelectric conversion film 11 are stacked on the semiconductor substrate 10 in this order, and further, a protective film 17, color filters 3 (3-1 to 3-4), on-chip lenses 18 (18-1 to 18-4) are stacked in this order. The organic photoelectric conversion film 11 has its upper and lower surfaces sandwiched between an upper electrode 13 and the lower electrode 14. The upper electrode 13 includes, for example, a transparent conductive film such as indium tin oxide film or indium zinc oxide film.

Also, of the pixels 2 (2-1 to 2-4), the pixel 2-1 has the yellow (Ye) color filter 3-1 formed over the organic photoelectric conversion film 11 on the light incidence side, the pixel 2-2 has the white (W) color filter 3-2 formed over the organic photoelectric conversion film 11 on the light incidence side, the pixel 2-3 has the cyan (Cy) color filter 3-3 formed over the organic photoelectric conversion film 11 on the light incidence side, and the pixel 2-4 has the white (W) color filter 3-4 formed over the organic photoelectric conversion film 11 on the light incidence side.

Here, as a color combination, the organic photoelectric conversion film 11 for green (G), a red (R) photodiode (not depicted) for the pixel 2-1, a magenta (M=R+B) photodiode (not depicted) for the pixel 2-2, a blue (B) photodiode (not depicted) for the pixel 2-3, and a magenta (M=R+B) photodiode (not depicted) for the pixel 2-4 can be used. However, other arbitrary color combinations are also possible. For example, a blue (B) or red (R) film can be used for the organic photoelectric conversion film 11. In that case, a color use can be specified for each of the four photodiodes of the pixels 2-1 to 2-4 depending on whether the organic photoelectric conversion film 11 is for blue (B) or red (R). In this case, the positions of the four photodiodes in the depth direction are specified in accordance with the color.

Signal charges generated in the pixels 2 (2-1 to 2-4) by the organic photoelectric conversion film 11 and the photodiodes are read out by a readout section that includes a plurality of pixel transistors and processed by a signal processing section, allowing the signal charges to be output as image data.

The optical waveguide 12 preferably has a refractive index greater than the first insulating film 16-1. This preferred mode allows for further effective prevention of entry of light into adjacent pixels through reflection by the interface between the optical waveguide 12 and the first insulating film 16-1.

The optical waveguide 12 preferably includes SiN and has a refractive index of 1.8 to 2.1, and the first insulating film 16-1 preferably includes SiO and has a refractive index of 1.3 to 1.5. This preferred mode allows for further effective prevention of entry of light into adjacent pixels through reflection by the interface between the optical waveguide 12 and the first insulating film 16-1.

The optical waveguide 12 is not particularly limited and may include an arbitrary material. However, the optical waveguide 12 may alternatively include a low-dielectric constant material. In the case where a low-dielectric constant material is used as a material of the optical waveguide 12, the capacitance can be further reduced. This further reduction in capacitance can be redirected to reduce the height, providing an effect of further improving sensitivity, shading, and color mixing. The low-dielectric constant material preferably has a refractive index of 1.6 to 1.8 which is greater than that of the first insulating film 16-1. Although the dielectric constant of the low-dielectric constant material is not particularly limited, the low-dielectric constant material preferably has a dielectric constant of 3.4 to 3.6.

Low-dielectric constant materials are not particularly limited. For example, however, transparent materials such as SiOC film and SiOCH film can be cited as low-dielectric constant materials.

The solid-state imaging device 1-1 may be, for example, a so-called vertical spectroscopic imaging device that has the organic photoelectric conversion film 11 and a photodiode (not depicted) stacked in a pixel in the direction of thickness of the semiconductor substrate 10 and that selectively detects light in different wavelength regions (e.g., B, G, and R light and so on) for photoelectric conversion, and the number of vertical spectroscopic layers is preferably two or three.

The thickness from the semiconductor substrate 10 to the organic photoelectric conversion film 11 is not particularly limited and may be an arbitrary thickness. However, the thickness is preferably 1 µm or less.

Also, the thickness from the semiconductor substrate 10 to the organic photoelectric conversion film 11 is not particularly limited from the viewpoint of reducing the capacitance. However, in the case of a cell size of approximately 2.0 µm, the thickness is preferably 300 nm or more, and in the case of a cell size of approximately 1.4 µm, the thickness is preferably 500 nm or more. Also, the thickness from the semiconductor substrate 10 to the organic photoelectric conversion film 11 is not particularly limited from the viewpoint of requiring pupil correction. However, pupil correction may be performed in the case where the thickness is 100 nm or more.

The optical waveguide 12 may include an organic film. Although the refractive index of the organic film is not particularly limited, the organic film preferably has a refractive index of 1.5 to 1.7. Although the dielectric constant of the organic film is not particularly limited, the organic film preferably has a dielectric constant of 3.4 to 3.6.

The optical waveguide 12 can be manufactured by a known method. For example, the insulating film 16 is formed flat first, after which the area which will be the optical waveguide 12 is dug in the shape of a hole (or a cylindrical column or a truncated cone). A material having a refractive index greater than the insulating film is filled into the dug hole. The portion in the shape of a hole (or a cylindrical column or a truncated cone) filled with the material having a great refractive index will be used as the optical waveguide 12.

It should be noted that, the photodiode inside the semiconductor substrate 10 (silicon) may have a two-layer structure. In that case, the organic photoelectric conversion film 11, first and second photodiodes 24-1a and 24-2a, respectively, included in the semiconductor substrate 10, and interconnect lasers (three lowermost interconnect layers in FIG. 1) may be disposed in this order from the light incidence side (from top to bottom in FIG. 1) so that, of incident light, green light is converted into an electric charge by the organic photoelectric conversion film, blue light is converted into an electric charge by the first photodiode 24-1a at the upper layer of the two-layer structure (layer provided on the side of the organic photoelectric conversion film), and red light is converted into an electric charge by the second photodiode 24-2a at the lower laser of the two-layer structure (layer that is on the side of the interconnect layer and that is disposed between the first photodiode 24-1a and the other surface of the semiconductor substrate 10 in which the interconnect layers are formed). It should be noted that, in that case, color filters are not needed.

The solid-state imaging device 1-1 of the first embodiment according to the present technology a back-illuminated type that allows increase in the amount of light received by a bulk silicon photodiode (not depicted). However, the back-illuminated solid-state imaging device 1-1 needs to include the through electrode 15 that penetrates the semiconductor substrate 10 (silicon substrate) in an electric charge readout path of the lower electrode 14 to read out the electric charge of the lower electrode 14 of the organic photoelectric conversion film 11. For this reason, comparing the back-illuminated solid-state imaging device 1-1 using the organic photoelectric conversion film 11 and a bulk silicon photodiode and a front-illuminated solid-state imaging device using a photoelectric conversion film and a bulk silicon photodiode, the back-illuminated solid-state imaging device 1-1 has a greater parasitic capacitance of the lower electrode 14 of the organic photoelectric conversion film. This may lead to a smaller signal during readout of a signal charge from the lower electrode 14, resulting in a poorer S/N ratio of the read-out signal. Comparing the back-illuminated solid-state imaging device 1-1 and a front-illuminated solid-state imaging device, the structure of the solid-state imaging device 1-1 of the first embodiment according to the present technology provides an operational effect in that the amount of light received by the bulk silicon photodiode is increased by back-illuminating the bulk silicon photodiode and in that the S/N ratio of the signal from the organic photoelectric conversion film 11 is increased by using the optical waveguide 12.

2. Second Embodiment (Back-Illuminated Solid-State Imaging Device)

A back-illuminated solid-state imaging device of a second embodiment according to the present technology includes at least a semiconductor substrate, an organic photoelectric conversion film, and an optical waveguide and further includes a second insulating film. The organic photoelectric conversion film is formed on one of front and back surfaces of the semiconductor substrate. The optical waveguide is formed between the semiconductor substrate and the organic photoelectric conversion film. The second insulating film is formed under the optical waveguide.

Figure 9:
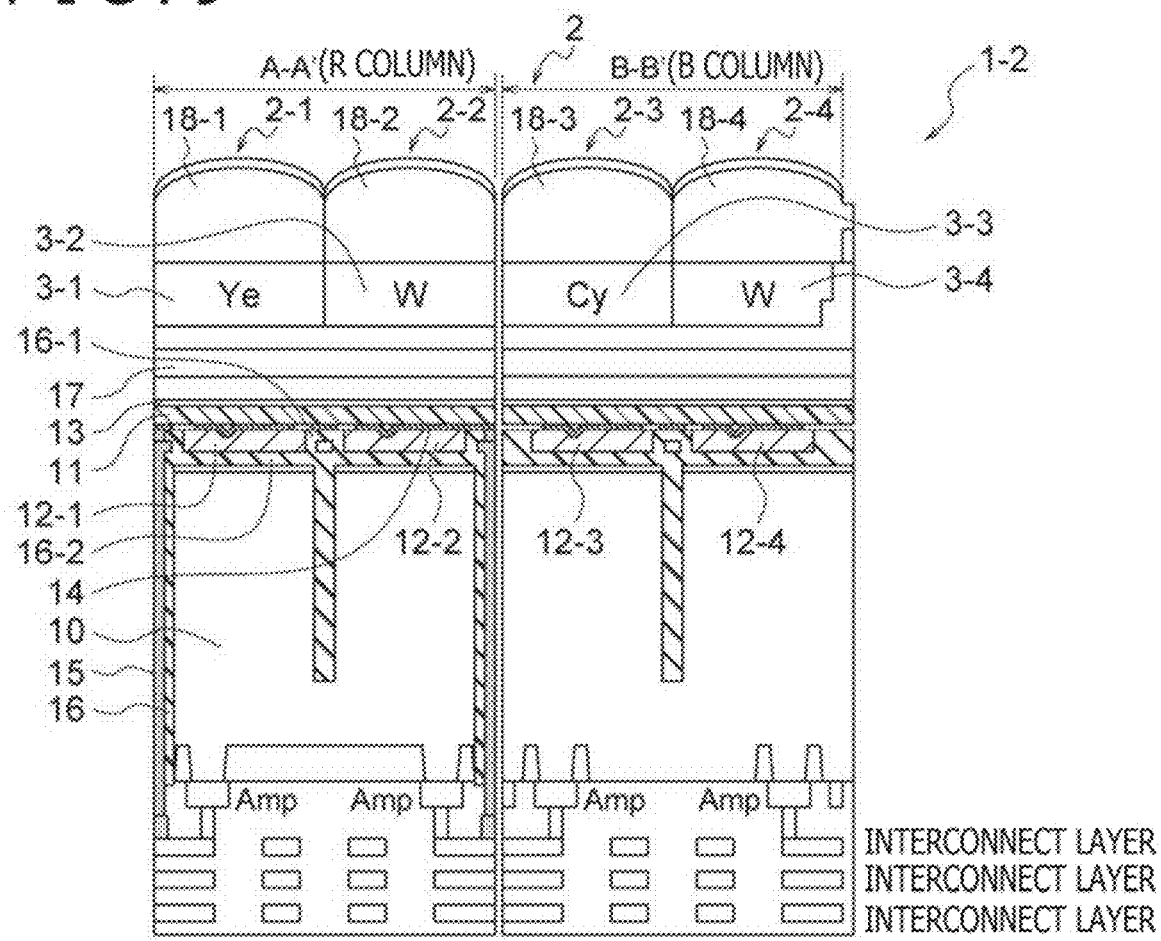
FIG. 9 is a cross-sectional view illustrating a configuration example of a back-illuminated solid-state imaging device of a second embodiment to which the present technology is applied.
Figure 10:
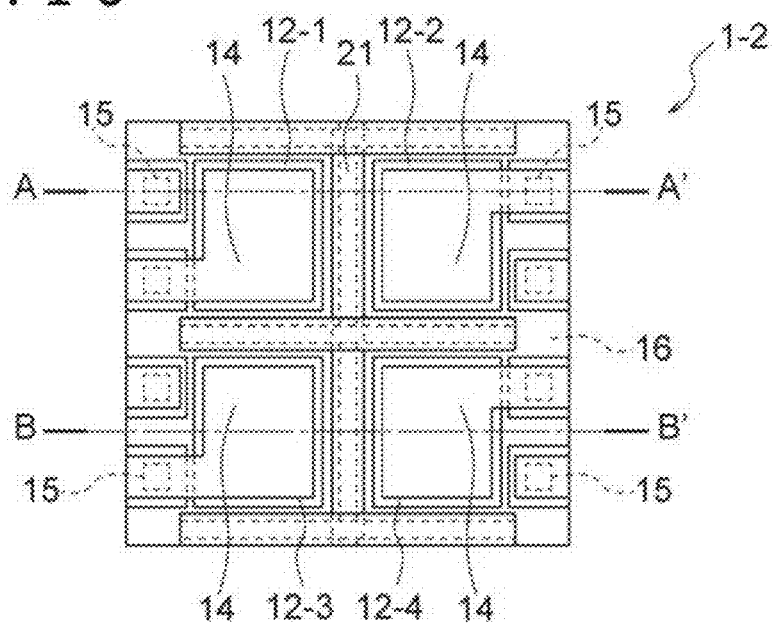
FIG. 10 is a plan view illustrating a configuration example of the back-illuminated solid-state imaging device of the second embodiment to which the present technology is applied.

FIGS. 9 and 10 illustrate the back-illuminated solid-state imaging device 1 (solid-state imaging device 1-2 in FIGS. 9 and 10) of the second embodiment according to the present technology.

The solid-state imaging device 1-2 includes the semiconductor substrate 10, the organic photoelectric conversion film 11, the optical waveguide 12, and the first insulating film 16-1. The organic photoelectric conversion film 11 is formed on one of surfaces of the semiconductor substrate. The optical waveguide 12 is formed between the semiconductor substrate 10 and the organic photoelectric conversion film 11. The optical waveguide 12 and the first insulating film 16-1 are perpendicularly (vertically in FIG. 9) separated. The solid-state imaging device 1-2 further includes a second insulating film 16-2 formed under the optical waveguide 12.

An insulating dielectric such as silicon oxide film, TEOS, silicon nitride film, or silicon oxide nitride film can be used, for example, as the second insulating film 16-2.

FIG. 9 is a diagram depicting, horizontally side by side, a cross-sectional view (A-A' (R column)) cutting through the back-illuminated solid-state imaging device 1-2 illustrated in the plan view of FIG. 10 as seen from the light incidence side along line A-A' and a cross-sectional view (B-B' (B column)) cutting through the back-illuminated solid-state imaging device 1-1 along line B-B' and depicts the four pixels 2 (pixels 2-1 to 2-4) of the solid-state imaging device 1-2.

Referring to FIG. 9, it is possible to prevent aggravation of white dots through depinning resulting from fixed charge of the optical waveguide 12 (e.g., SIN) by separating the optical waveguide 12 and the semiconductor substrate 10 with the second insulating film 16-2.

Details of the pixels 2 (pixels 2-1 to 2-4) of the solid-state imaging device 1-2 are similar to those of the pixels 2 (pixels 2-1 to 2-4) of the back-illuminated solid-state imaging device 1-1 of the first embodiment described above.

3. Third Embodiment (Back-Illuminated Solid-State Imaging Device)

A back-illuminated solid-state imaging device of a third embodiment according to the present technology includes at least a semiconductor substrate, an organic photoelectric conversion film, and an optical waveguide and further includes a low-dielectric-constant material layer. The organic photoelectric conversion film is formed on one of front and back surfaces of the semiconductor substrate. The optical waveguide is formed between the semiconductor substrate and the organic photoelectric conversion film. The low-dielectric-constant material layer is formed under the optical waveguide.

Figure 11:
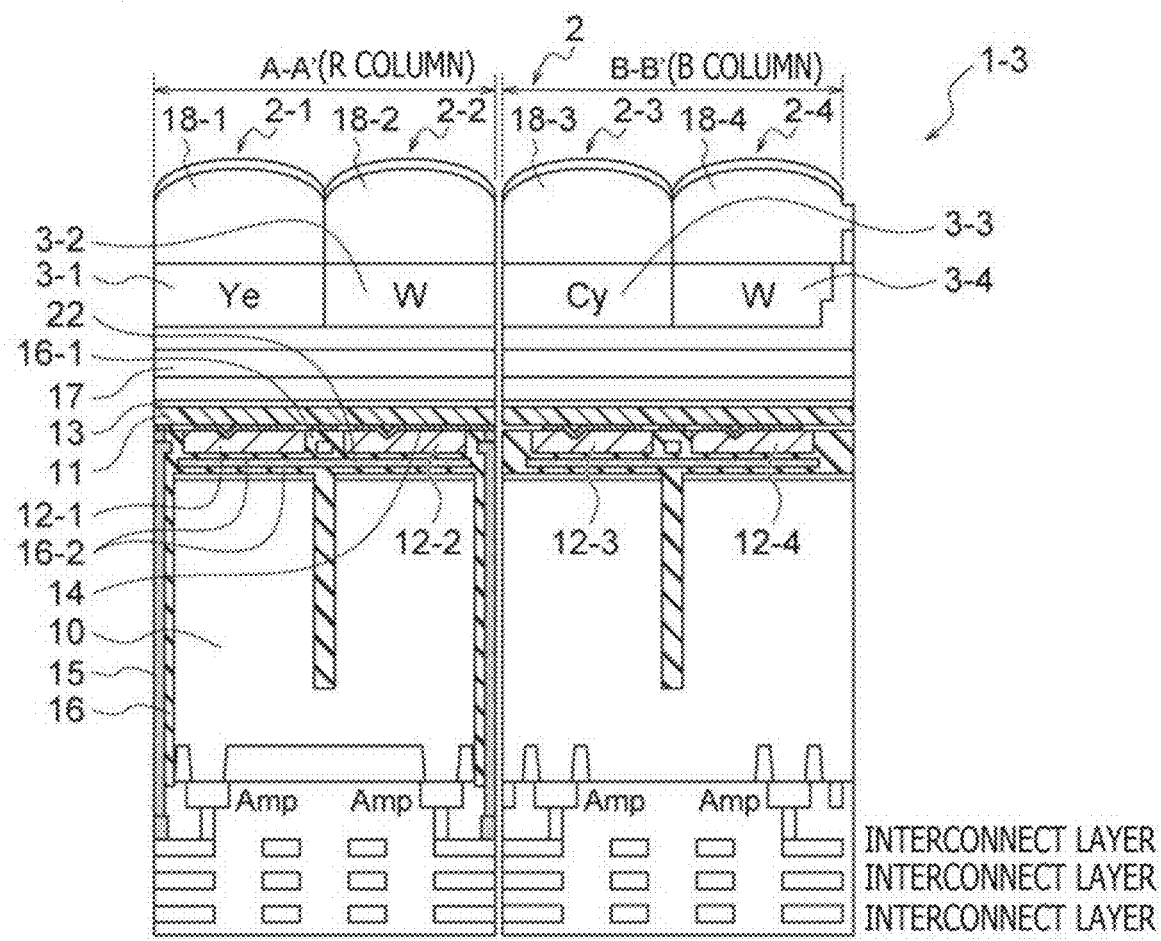
FIG. 11 is a cross-sectional view illustrating a configuration example of a back-illuminated solid-state imaging device of a third embodiment to which the present technology is applied.
Figure 12:
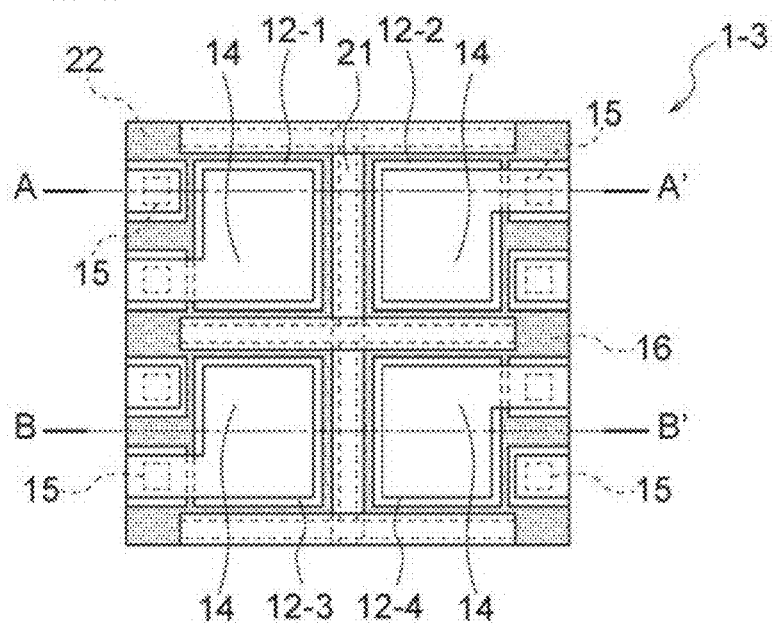
FIG. 12 is a plan view illustrating a configuration example of the back-illuminated solid-state imaging device of the third embodiment to which the present technology is applied.

FIGS. 11 and 12 illustrate the back-illuminated solid-state imaging device 1 (solid-state imaging device 1-3 in FIGS. 11 and 12) of the third embodiment according to the present technology. The solid-state imaging device 1-3 includes the semiconductor substrate 10, the organic photoelectric conversion film 11, the optical waveguide 12, the first insulating film 16-1, and the second insulating film 16-2. The organic photoelectric conversion film 11 is formed on one of surfaces of the semiconductor substrate. The optical waveguide 12 is formed between the semiconductor substrate 10 and the organic photoelectric conversion film 11. The optical waveguide 12 and the first insulating film 16-1 are perpendicularly (vertically in FIG. 11) separated. The second insulating film 16-2 is formed under the optical waveguide 12. The solid-state imaging device 1-3 further includes a low-dielectric-constant material layer 22 formed between the optical waveguide 12 and the second insulating film 16-2.

FIG. 11 is a diagram depicting, horizontally side by side, a cross-sectional view (A-A' (R column)) cutting through the back-illuminated solid-state imaging device 1-3 illustrated in the plan view of FIG. 12 as seen from the light incidence side along line A-A' and a cross-sectional view (B-B' (B column)) cutting through the back-illuminated solid-state imaging device 1-1 along line B-B' and depicts the four pixels 2 (pixels 2-1 to 2-4) of the solid-state imaging device 1-3.

By forming the low-dielectric-constant material layer 22 between the optical waveguide 12 and the second insulating film 16-2, it is possible to further reduce the capacitance. This further reduction in capacitance can be redirected to reduce the height, providing an effect of further enhancing image quality, and in particular, an effect of further improving sensitivity, shading, and color mixing.

The low-dielectric-constant material layer 22 may be a layer including a low-dielectric constant material. Although the refractive index of the low-dielectric constant material is not particularly limited, the low-dielectric constant material preferably has a refractive index of 1.6 to 1.8. Although the dielectric constant of the low-dielectric constant material is not particularly limited, the low-dielectric constant material preferably has a dielectric constant of 3.4 to 3.6.

The low-dielectric constant material is not particularly limited. For example, however, transparent materials such as SiOC film and SiOCH film can be cited as low-dielectric constant materials.

Details of the pixels 2 (pixels 2-1 to 2-4) of the solid-state imaging device 1-3 are similar to those of the pixels 2 (pixels 2-1 to 2-4) of the back-illuminated solid-state imaging device 1-1 of the first embodiment described above.

4. Fourth Embodiment (Back-Illuminated Solid-State Imaging Device)

A back-illuminated solid-state imaging device of a fourth embodiment according to the present technology includes at least a semiconductor substrate, an organic photoelectric conversion film, and an optical waveguide and further includes an inner lens. The organic photoelectric conversion film is formed on one of front and back surfaces of the semiconductor substrate. The optical waveguide is formed between the semiconductor substrate and the organic photoelectric conversion film. The inner lens is formed between the organic photoelectric conversion film and the optical waveguide.

Figure 13:
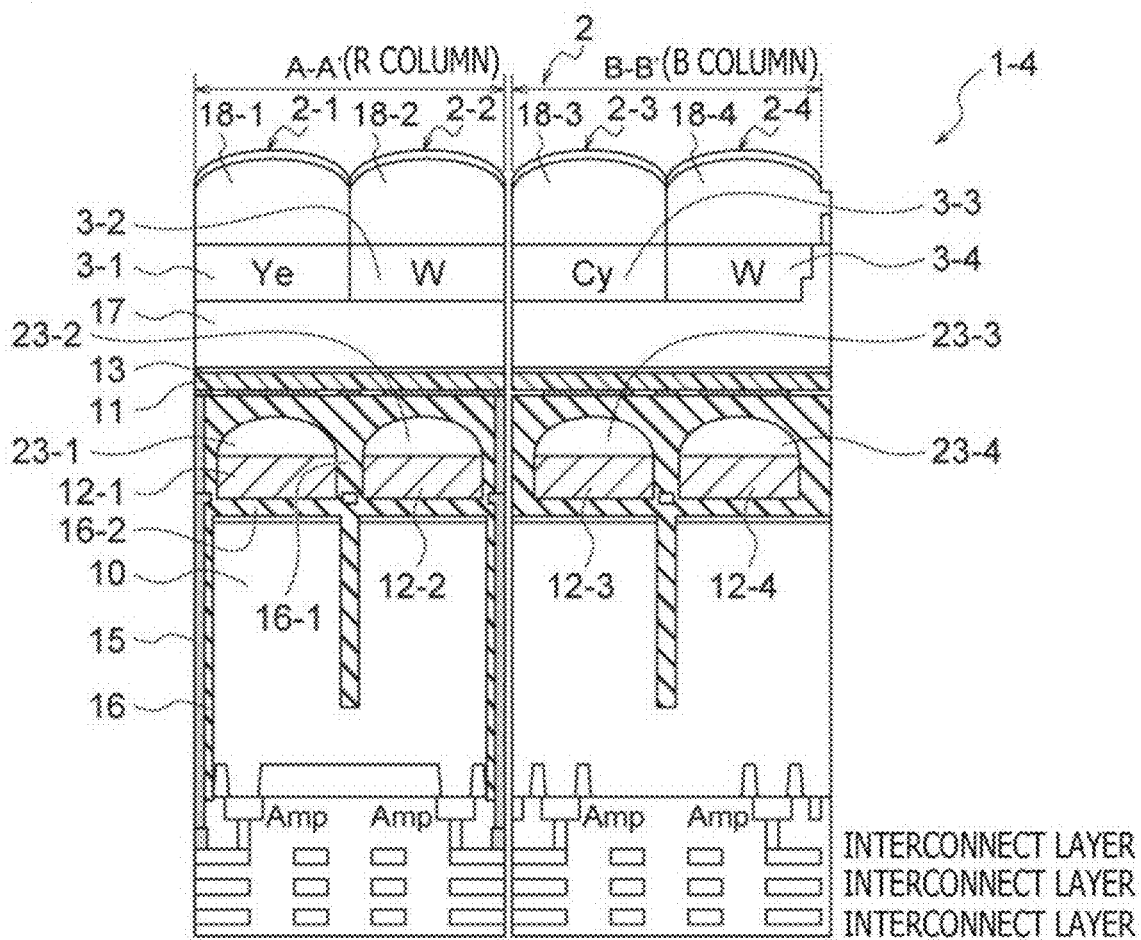
FIG. 13 is a cross-sectional view illustrating a configuration example of a back-illuminated solid-state imaging device of a fourth embodiment to which the present technology is applied.
Figure 14:
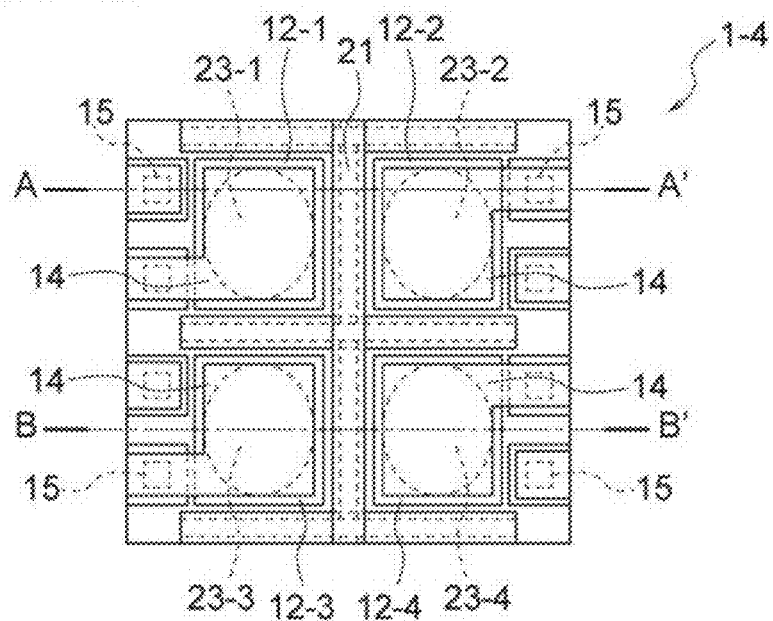
FIG. 14 is a plan view illustrating a configuration example of the back-illuminated solid-state imaging device of the fourth embodiment to which the present technology is applied.

FIGS. 13 and 14 illustrate the back-illuminated solid-state imaging device 1 (solid-state imaging device 1-4 in FIGS. 13 and 14) of the fourth embodiment according to the present technology.

The solid-state imaging device 1-4 includes the semiconductor substrate 10, the organic photoelectric conversion film 11, the optical waveguide 12, the first insulating film 16-1, and the second insulating film 16-2. The organic photoelectric conversion film 11 is formed on one of surfaces of the semiconductor substrate. The optical waveguide 12 is formed between the semiconductor substrate 10 and the organic photoelectric conversion film 11. The optical waveguide 12 and the first insulating film 16-1 are perpendicularly (vertically in FIG. 13) separated. Also, the first insulating film 16-1 is formed over the optical waveguide 12, and further, the second insulating film 16-2 is formed under the optical waveguide 12. The solid-state imaging device 1-4 further includes inner lenses 23 (23-1 to 23-4) that are formed between the organic photoelectric conversion film 11 (and the first insulating film 16-1) and the optical waveguide 12.

FIG. 13 is a diagram depicting, horizontally side by side, a cross-sectional view (A-A' (R column)) cutting through the back-illuminated solid-state imaging device 1-4 illustrated in the plan view of FIG. 14 as seen from the light incidence side along line A-A' and a cross-sectional view (B-B' (B column)) cutting through the back-illuminated solid-state imaging device 1-4 along line B-B' and depicts four pixels 2 (pixels 2-1 to 2-4) of the solid-state imaging device 1-1.

By inserting the inner lenses 23 (23-1 to 23-4) between the organic photoelectric conversion film 11 and the optical waveguide 12, i.e., between the first insulating film 16-1 and the optical waveguide 12, it is possible to concentrate light from the on-chip lenses 18 (18-1 to 18-4) with more efficiency for each of the pixels 2-1 to 2-4. Therefore, both the optical waveguide 12 and the inner lenses 23 are formed in the solid-state imaging device 1-4, providing a synergetic effect of improving color mixing in adjacent pixels. Also, because the insertion of the inner lenses 23 provides a synergetic effect of improving color mixing in adjacent pixels as described above, the first insulating film 16-1 can be further thickened as illustrated in FIG. 13, thereby making it possible to increase the thickness from the semiconductor substrate 10 to the organic photoelectric conversion film 11. This increase in thickness allows for reduction of the capacitance between the semiconductor substrate 10 and the lower electrode 14 for the organic photoelectric conversion film 11, possibly preventing the decline in conversion efficiency and the aggravation of random noise (RN). Then, in particular, it is possible to strike a balance between the effect of improving sensitivity, shading, and color mixing and the effect of preventing the decline in conversion efficiency and the aggravation of random noise (RN).

The inner lenses 23 can include, for example, plasma silicon nitride (P-SiN; refractive index of approximately 1.9 to 2.0). Although the inner lenses 23 may take on an arbitrary shape, they may also be semi-spherical as are the on-chip lenses 18 as illustrated in FIG. 13 or may take on other shape. For example, the inner lenses 23 may be rectangular.

Details of the pixels 2 (pixels 2-1 to 2-4) of the solid-state imaging device 1-4 are similar to those of the pixels 2 (pixels 2-1 to 2-4) of the back-illuminated solid-state imaging device 1-1 of the first embodiment described above.

5. Fifth Embodiment (Back-Illuminated Solid-State Imaging Device)

A back-illuminated solid-state imaging device of a fifth embodiment according to the present technology includes at least a semiconductor substrate, an organic photoelectric conversion film, and an optical waveguide and further includes a second lower electrode, a via, and a photodiode. The organic photoelectric conversion film is formed on one of front and back surfaces of the semiconductor substrate. The optical waveguide is formed between the semiconductor substrate and the organic photoelectric conversion film. The second lower electrode is connected to a first lower electrode and formed at a lower position than the first lower electrode. The via connects the first lower electrode and the second lower electrode. The photodiode is formed at a lower position than the second lower electrode. A first distance between the center of the photodiode and the center of the via at a view angle center and a second distance between the center of the photodiode and the center of the via at a view angle end are different.

FIGS. 15 to 18 illustrate the back-illuminated solid-state imaging device 1 (solid-state imaging device 1-5 in FIGS. 15 to 18) of the fifth embodiment according to the present technology.

The solid-state imaging device 1-5 has a structure that has factored in pupil correction.

Figure 15:
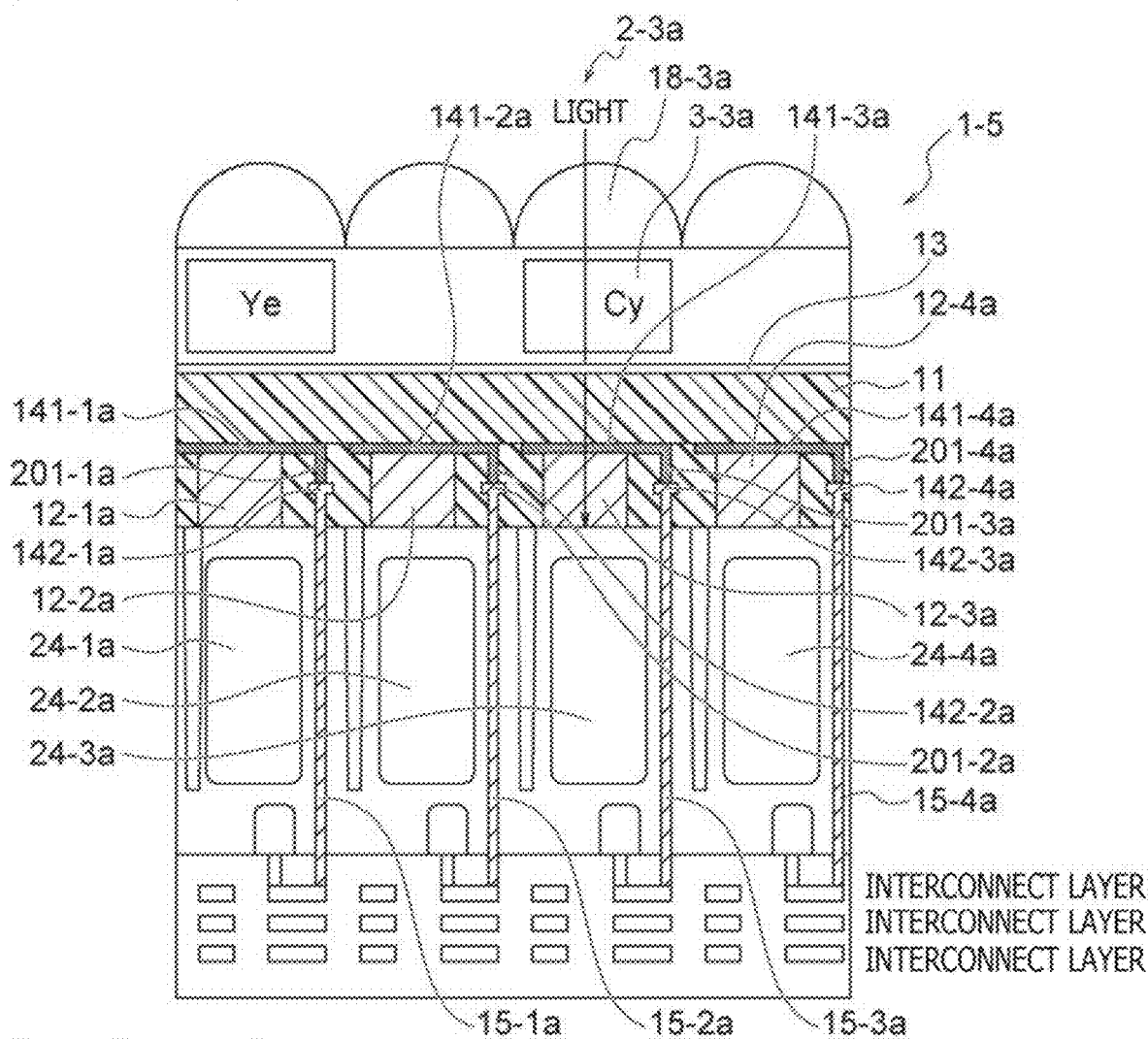
FIG. 15 is a cross-sectional view illustrating a configuration example of a back-illuminated solid-state imaging device of a fifth embodiment to which the present technology is applied.
Figure 16:
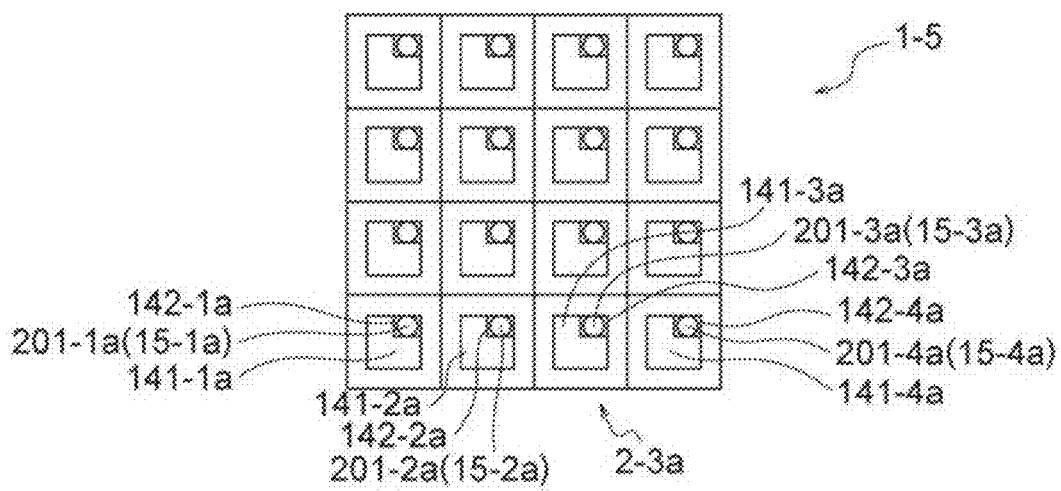
FIG. 16 is a plan view illustrating a configuration example of the back-illuminated solid-state imaging device of the fifth embodiment to which the present technology is applied.
Figure 17:
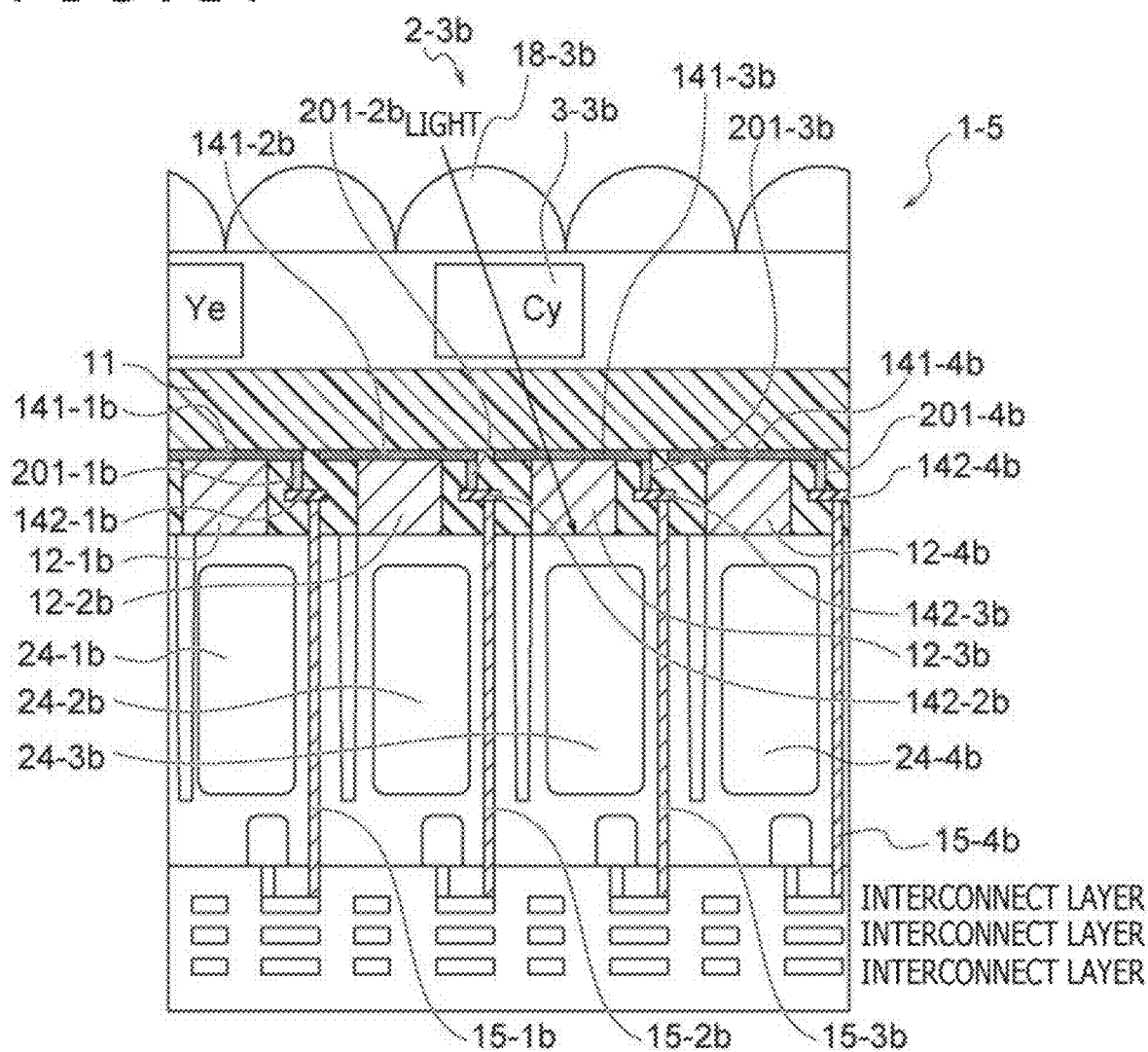
FIG. 17 is a cross-sectional view illustrating a configuration example of the back-illuminated solid-state imaging device of the fifth embodiment to which the present technology is applied.
Figure 18:
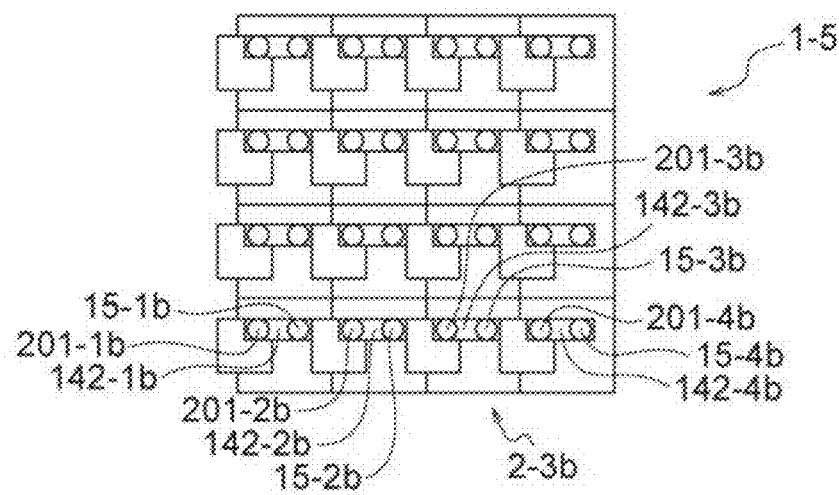
FIG. 18 is a plan view illustrating a configuration example of the back-illuminated solid-state imaging device of the fifth embodiment to which the present technology is applied.

FIGS. 15 and 16 illustrate a structure of the solid-state imaging device 1-5 at the view angle center, and FIGS. 17 and 18 illustrate a structure of the solid-state imaging device 1-5 at the view angle end. In the description given below, the structure relating to pupil correction arranged at the view angle center will be denoted by reference numeral 'a,' and the structure relating to pupil correction arranged at the view angle end will be denoted by reference numeral 'b' for description.

The solid-state imaging device 1-5 includes the semiconductor substrate 10, the organic photoelectric conversion film 11, and the optical waveguide 12. The organic photoelectric conversion film 11 is formed on one of surfaces of the semiconductor substrate. The optical waveguide 12 is formed between the semiconductor substrate 10 and the organic photoelectric conversion film 11. The solid-state imaging device 1-5 further includes first lower electrodes 141 (141-1 to 141-4), second lower electrodes 142 (142-1 to 142-4), vias 201 (201-1 to 201-4), and photodiodes 24 (24-1 to 24-4). The second lower electrodes 142 (142-1 to 142-4) are connected to the first lower electrodes 141 (141-1 to 141-4) and formed at lower positions than the first lower electrodes 141 (141-1 to 141-4). The vias 201 (201-1 to 201-4) connect the first lower electrodes 141 (141-1 to 141-4) and the second lower electrodes 142 (142-1 to 142-4). The photodiodes 24 (24-1 to 24-4) are formed at lower positions than the second lower electrodes 142 (142-1 to 142-4).

In the solid-state imaging device 1-5, the first distance and the second distance are different. The first distance is between the centers of the photodiodes 24 (24-1a to 24-4a) and the centers of the vias 201 (201-1a to 201-4a) at the view angle centers. The second distance is between the centers of the photodiodes 24 (24-1b to 24-4b) and the centers of the vias 201 (201-1b to 201-4b) at the view angle ends.

Light enters the imaging surfaces of the on-chip lenses 18 (18-1 to 18-4) at various angles. Therefore, assuming that the pixels 2 (2-1 to 2-4) at the view angle centers and the pixels 2 (2-1 to 2-4) at the view angle ends have similar structures, light cannot be concentrated efficiently, resulting in a sensitivity difference between the pixels 2 at the view angle centers and the pixels 2 at the view angle ends.

In order to ensure that there is no sensitivity difference between the pixels 2 at the view angle centers and the pixels 2 at the view angle ends and provide a constant sensitivity, there is, for example, a technique called pupil correction or the like that aligns optical axes of the on-chip lenses 18 (18-1 to 18-4) and apertures of the photodiodes 24 (24-1 to 24-4) at the center of the imaging surface (view angle center) and changes the positions of the photodiodes 24 (24-1 to 24-4) toward the view angle ends with change in direction of a principal ray.

Incident light enters the pixel 2 arranged at a view angle center area approximately perpendicularly with respect to the photodiode 24-3*a* as illustrated by an arrow in FIG. 15. However, incident light enters the pixel 2 arranged at a view angle end area diagonally with respect to the photodiode 24-3*b* as illustrated by an arrow in FIG. 17.

The on-chip lens 18-3*b* and the cyan (Cy) color filter 3-3*b* have undergone pupil correction to enable efficient concentration of light even for diagonal incident light. The amount of that pupil correction grows greater from the view angle center (e.g., pixel section center) toward the view angle end.

Referring to FIG. 15, incident light enters the pixel 2-3*a* at the view angle center, for example, from the direction of the central axis of the on-chip lens 18-3*a*. Therefore, incident light concentrated by the on-chip lens 18-3*a* is dispersed by passing through the cyan (Cy) color filter 3-3*a* and then enters the photodiode 24-3*a*.

That is, in the pixel 2-3*a* at the view angle center, incident light that has passed through the center of the on-chip lens 18-3*a* passes through the center of the cyan (Cy) color filter 3-3*a* and is irradiated onto the center of the photodiode 24-3*s*. Therefore, the pixel 2-3*a* at the view angle center is not subjected to pupil correction.

Referring to FIG. 17, in the pixel 2-3*b* at the view angle end located off the view angle center, the on-chip lens 18-3*b* and the cyan (Cy) color filter 3-3*b* have undergone pupil correction to enable efficient concentration of light even for diagonal incident light. In FIG. 17, the cyan (Cy) color filter 3-3*b* is arranged at a position out of alignment by a given amount to the left with an aperture section of the photodiode 24-3*b* in the figure. Further, the on-chip lens 18-3*b* is arranged at a position out of alignment by a given amount to the left with the cyan (Cy) color filter 3-3*b*.

The amount of misalignment of the on-chip lenses 18 and the color filters 3 grows greater from the view angle center area toward the view angle end. In addition to the on-chip lens 18-3*b* and the cyan (Cy) color filter 3-3*b*, the upper electrode 141-3*b* (transparent electrode) is also arranged out of alignment to match the positions of the on-chip lens 18-3*b* and the cyan (Cy) color filter 3-3*b*.

FIGS. 16 and 18 are plan views of the pixel 2 as seen from the on-chip lens 18. FIG. 16 is a plan view of the pixel 2 at the view angle center, and FIG. 18 is a plan view of the pixel 2 at the view angle end.

Referring to FIG. 15, the first lower electrode 141-3*a* of the pixel 2-3*a*, for example, located at the view angle center is connected to the second lower electrode 142-3*a* via the via 201-3*a*, and the second lower electrode 142-3*a* is connected to a through electrode 15-3*a*. Similarly, referring to FIG. 17, for example, the first lower electrode 141-3*b* of the pixel 2-3*b* located at the view angle end is connected to the second lower electrode 142-3*b* via the via 201-3*b*, and the second lower electrode 142-3*b* is connected to a through electrode 15-3*b*.

Thus, the first lower electrodes 141 of each of the pixels 2 are connected to the second lower electrodes 142 via the vias 201, and the second lower electrodes 142 are connected to the through electrodes 15.

The vias 201 are provided as vias at the time of manufacture and, for example, form electrodes connected to the first lower electrodes 141 as a result of filling of the same material as the first lower electrodes 141. In the case where transparent electrodes that include a transparent material are used as the first lower electrodes 141, the material filled into the vias 201 is also a material that can form transparent electrodes, and the same material as included in the first lower electrodes 141 can be used.

The through electrodes 15 are formed by forming through holes at the time of manufacture and filling an electrode material into the through holes. The second lower electrodes 142 are formed by etching the through electrodes 15 after the formation thereof through photolithography or other technique and by filling a material that functions as an electrode such as a material similar to that of the through electrodes 15.

Alternatively, the second lower electrodes 142 may include the same material as the first lower electrodes 141. In the case where transparent electrodes are used as the first lower electrodes 141, transparent electrodes can also be used as the second lower electrodes 142.

It should be noted that the through electrodes 15 can be provided between pixels to function as light-shielding walls that prevent leakage of light into adjacent pixels. In the case where the through electrodes 154 have such a function, the through electrodes 15 include a light-shielding material. In contrast to the through electrodes 15, the second lower electrodes 142 are located at positions partially overlapping the photodiodes 24, possibly shielding incident light to the photodiodes 24. In order to reduce such a possibility, transparent electrodes may be used as the second lower electrodes 142 as with the first lower electrodes 141.

Referring to FIGS. 16 and 18, the photodiodes 24 are formed at equal intervals. At the view angle center, the first lower electrode 141-3*a* is arranged at a center portion of the photodiode 24-3*a* as illustrated in FIG. 16. In contrast, at the view angle end, the first lower electrode 141-3*b* is arranged at a position out of alignment to the left (toward the view angle center) with the center portion of the photodiode 24-3*b* as illustrated in FIG. 18.

As described above, at the view angle end, the first lower electrode 141-3*b* (transparent electrode 141-3*b*) is arranged at a position out of alignment with the light receiving section (photodiode 24-3*b*) provided in the silicon layer of the semiconductor substrate 10 for pupil correction, thereby keeping the decline in sensitivity to diagonal incident light to a minimum.

At the view angle center, the via 201-3*a* and the through electrode 15-3*a* are formed approximately at the same position as illustrated in FIGS. 15 and 16. In contrast, at the view angle end, the via 201-3*b* and the through electrode 15-3*b* are formed at different positions as illustrated in FIGS. 17 and 18. Thus, the positional relationship between the via 201 and the through electrode 15 changes with change in the pixel position.

In the case where the via 201-3*b* and the through electrode 15-3*b* are formed at the same position rather than at different positions, that is, the via 201-3*b* and the through electrode 15-3*b* are formed at the same position as with the pixels 2 located at the view angle center, there is a possibility that a via 201-3*b*' (the via 201-3*b* and the through electrode 15-3*b* will be hereinafter marked with a dash in the case where the via 201-3*b* and the through electrode 15-3*b* are formed at the same position at the view angle end) cannot be connected to the second lower electrode 142.

At the view angle end, the first lower electrode 141-3*b* is arranged at a position out of alignment with the first lower electrode 141-3*a* located at the view angle center. Therefore, in the case where the via 201-3*b*' is formed at the same position as the through electrode 15-3*b*', there is a possibility that the via 201-3*b*' may be formed outside the first lower electrode 141-3*b*.

In such a case, the first lower electrode 141-3*b* and the via 201-3*b*' are not connected. As a result, the first lower electrode 141-3*b* and the through electrode 15-3*b*' are left disconnected, making it impossible to perform readout from this pixel 2-3*b*.

That is, it is possible to keep the decline in sensitivity to diagonal incident light to a minimum by forming the first lower electrodes 141, located under the organic photoelectric conversion film 11, out of alignment with the photodiodes 24. However, in the case where the amount of pupil correction is great, there is a possibility that the first lower electrodes 141 may protrude from the unit pixel in the silicon layer of the semiconductor substrate 10. In such a case, a readout circuit of the organic photoelectric conversion film 11 is arranged in the unit pixel inside the silicon substrate, possibly making it impossible to transfer the potential of the organic photoelectric conversion film 11 into the unit pixel. In order to reduce such a possibility, it is necessary to limit the amount of pupil correction and configure the first lower electrodes 141 in such a manner that they do not protrude from the unit pixel in the silicon layer.

In order to ensure proper pupil correction without limiting the amount of pupil correction, as depicted in FIGS. 16 and 18, the solid-state imaging device 1-5 includes, in the one pixel 2, the transparent first lower electrode 141-3*b* connected to the organic photoelectric conversion film 11 and the second lower electrode 142-3*b* connected to the first lower electrode 141-3*b*, and the pixel 2 is configured such that the first lower electrode 141-3*b* and the via 201-3*b* connecting the first lower electrode 141-3*b* and the second lower electrode 142-3*b* are formed at positions out of alignment with the unit pixel in the silicon substrate to match the positions from the optical center.

Thus, by moving the via 201-3*b* together with the first lower electrode 141-3*b*, it is possible to transfer a signal into the unit pixel in the semiconductor substrate 10 (silicon substrate) using the second lower electrode 142-3*b* even if the first lower electrode 141-3*b* is out of alignment with the unit pixel of the semiconductor substrate 10.

The solid-state imaging device 1-5 further includes the optical waveguides 12 (12-1 to 12-4). As compared with the mode in which pupil correction is performed that linearly corrects the positions of the on-chip lenses, the color filters, the lower electrodes, and the photodiodes in accordance with the direction of travel of diagonally incident light without including any optical waveguides 12, the solid-state imaging device 1-5 that includes optical waveguides between the lower electrodes and the photodiodes can guide light to travel downward, i.e., toward the photodiodes. Therefore, the amount of pupil correction between the lower electrodes and the photodiodes can be reduced to a smaller level than in the mode having no optical waveguides 12. The reduction of the amount of pupil correction between the lower electrodes and the photodiodes allows for downsizing of the second lower electrodes 142. The downsizing of the second lower electrodes 142 allows for reduction of parasitic capacitance from the lower electrodes to the through electrodes. By the reduction of parasitic capacitance, the solid-state imaging device 1-5 can reduce the decline in conversion efficiency and the aggravation of random noise (RN).

6. Sixth Embodiment (Electronic Apparatus)

An electronic apparatus of a sixth embodiment according to the present technology incorporates a back-illuminated solid-state imaging device that includes at least a semiconductor substrate, an organic photoelectric conversion film, and an optical waveguide. The organic photoelectric conversion film is formed on one of front and back surfaces of the semiconductor substrate. The optical waveguide is formed between the semiconductor substrate and the organic photoelectric conversion film. Further, the electronic apparatus of the sixth embodiment according to the present technology may be an electronic apparatus incorporating the back-illuminated solid-state imaging devices of the first to fifth embodiments according to the present technology.

Figure 19:
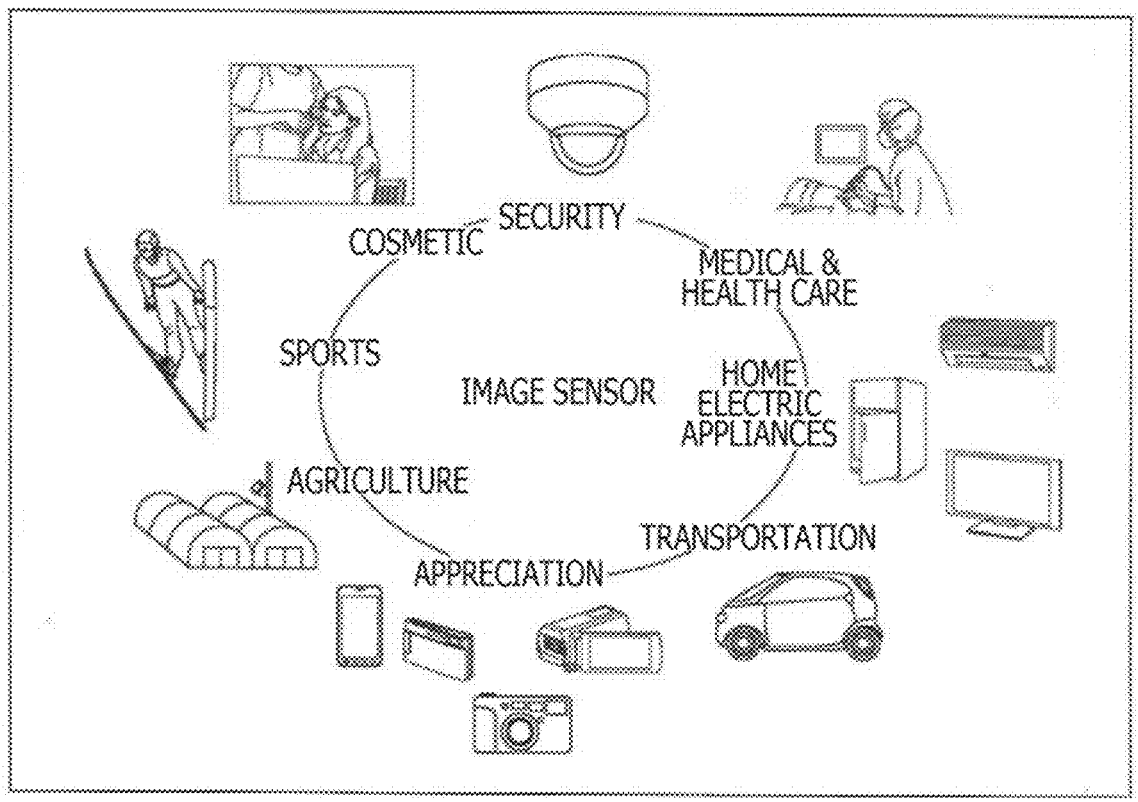
FIG. 19 is a diagram illustrating usage examples of the back-illuminated solid-state imaging devices of the first to fifth embodiments to which the present technology is applied.

7. Usage Examples of the Back-Illuminated Solid-State Imaging Devices to which the Present Technology is Applied FIG. 19 is a diagram illustrating usage examples in which the back-illuminated solid-state imaging devices described above are used. The back-illuminated solid-state imaging devices described above can find application, for example, in a variety of cases where visible light, infrared light, ultraviolet light, X-ray, and other light are sensed as described below.

- Apparatuses for shooting images for appreciation such as digital camera and mobile phone having a camera function
- Apparatuses for traffic use such as vehicle-mounted sensor for shooting front, back, surroundings, inside, and so on of an automobile for safe driving such as automatic stop and for recognition of driver's state, monitoring camera for monitoring traveling vehicles and road, and distance measuring sensor for measuring vehicle-to-vehicle distance and so on
- Apparatuses for use in home electric appliances such as TV, refrigerator, and air-conditioner to shoot a user's gesture and operate the appliance in accordance with the gesture
- Apparatuses for medical and healthcare use such as endoscope and apparatus for shooting blood cells by receiving infrared light
- Apparatuses for security use such as monitoring camera for crime prevention and camera for individual authentication
- Apparatuses for cosmetic use such as skin measuring device for shooting skin and microscope for shooting scalp
- Apparatuses for sports use such as action camera and wearable camera for sports applications
- Apparatuses for agricultural use such as camera for monitoring fields and crops It should be noted that embodiments according to the present technology are not limited to those described above and can be modified in various ways without departing from the gist of the present technology.

It should be noted that the effects described in the present specification are merely illustrative and not limited and that there may be other effects.

It should be noted that the present technology can have the following configurations:

[1]

A back-illuminated solid-state imaging device including at least:
a semiconductor substrate;
an organic photoelectric conversion film formed on one of front and back surfaces of the semiconductor substrate; and
an optical waveguide formed between the semiconductor substrate and the organic photoelectric conversion film.

[2]

The back-illuminated solid-state imaging device of feature [1], including:
a lower electrode provided under the organic photoelectric conversion film; and
a through electrode that penetrates the semiconductor substrate to transfer an electric charge, converted through photoelectric conversion of the organic photoelectric conversion film, to the side of the other of the front and back surfaces of the semiconductor substrate,
in which the lower electrode and the through electrode are connected.

[3]

The back-illuminated solid-state imaging device of feature [1], including:
a lower electrode provided under the organic photoelectric conversion film;
a through electrode adapted to penetrate the semiconductor substrate to transfer an electric charge, converted through photoelectric conversion of the organic photoelectric conversion film, to the side of the other of the front and back surfaces of the semiconductor substrate; and
at least an interconnect layer adapted to connect the lower electrode and the through electrode.

[4]

The back-illuminated solid-state imaging device of any one of features [1] to [3], in which
the semiconductor substrate includes a first photodiode, and
at least part of incident light not converted into an electric charge by the organic photoelectric conversion film is converted into an electric charge by the first photodiode.

[5]

The back-illuminated solid-state imaging device of feature [4], in which
the semiconductor substrate includes a second photodiode, and
the second photodiode is provided between the first photodiode and the other of the front and back surfaces of the semiconductor substrate, and at least part of incident light not converted into an electric charge by the organic photoelectric conversion film and the first photodiode is converted into an electric charge by the second photodiode.

[6]

The back-illuminated solid-state imaging device of any one of features [1] to [5], further including:
a first insulating film formed between the semiconductor substrate and the organic photoelectric conversion film.

[7]

The back-illuminated solid-state imaging device of feature [6], in which
the optical waveguide and the first insulating film are perpendicularly separated.

[8]

The back-illuminated solid-state imaging device of feature [6] or [7], in which
the optical waveguide has a refractive index greater than the first insulating film.

[9]

The back-illuminated solid-state imaging device of any one of features [6] to [8], in which
the optical waveguide includes SiN and has a refractive index of 1.8 to 2.1, and
the first insulating film includes SiC and has a refractive index of 1.3 to 1.5.

[10]

The back-illuminated solid-state imaging device of any one of features [1] to [9], in which
the optical waveguide includes a low-dielectric constant material.

The back-illuminated solid-state imaging device of any one of features [1] to [10], in which
the number of vertical spectroscopic layers is two or three.

[12]

The back-illuminated solid-state imaging device of any one of features [1] to [11], in which
the thickness from the semiconductor substrate to the organic photoelectric conversion film is 1 μm or less.

[13]

The back-illuminated solid-state imaging device of any one of features [1] to [12], in which
the optical waveguide includes an organic film.

[14]

The back-illuminated solid-state imaging device of any one of features [1] to [13], further including:
a second insulating film formed under the optical waveguide.

[15]

The back-illuminated solid-state imaging device of any one of features [1] to [14], further including:
a low-dielectric-constant material layer formed under the optical waveguide.

[16]

The back-illuminated solid-state imaging device of any one of features [1] to [15], further including:
an inner lens formed between the organic photoelectric conversion film and the optical waveguide.

[17]

The back-illuminated solid-state imaging device of any one of features [1] to [16], further including:
a first lower electrode;
a second lower electrode connected to the first lower electrode and formed at a lower position than the first lower electrode;
a via adapted to connect the first lower electrode and the second lower electrode; and
a photodiode formed at a lower position than the second lower electrode,
in which a first distance between the center of the photodiode and the center of the via at a view angle center and a second distance between the center of the photodiode and the center of the via at a view angle end are different.

[18]

An electronic apparatus incorporating a back-illuminated solid-state imaging device, the back-illuminated solid-state imaging device including at least
a semiconductor substrate,
an organic photoelectric conversion film formed on one of front and back surfaces of the semiconductor substrate, and
an optical waveguide formed between the semiconductor substrate and the organic photoelectric conversion film.

[19]

An electronic apparatus incorporating the back-illuminated solid-state imaging device of any one of features [2] to [17].

REFERENCE SIGNS LIST 1 (1-1 to 1-5): Solid-state imaging device
2 (2-1 to 2-4): Pixel
3 (3-1 to 3-4): Color filter
10: Semiconductor substrate
11: Organic photoelectric conversion film
12 (12-1 to 12-4): Optical waveguide

What is claimed is:

1. A back-illuminated solid-state imaging device comprising at least:
a semiconductor substrate;
an organic photoelectric conversion film formed on one surface of the semiconductor substrate;
an optical waveguide formed between the semiconductor substrate and the organic photoelectric conversion film; and
a first insulating film formed between the semiconductor substrate and the organic photoelectric conversion film and extending beyond a length of the optical waveguide in a vertical direction from the organic photoelectric conversion film towards the semiconductor substrate.

2. The back-illuminated solid-state imaging device of claim 1, further comprising:
a lower electrode provided under the organic photoelectric conversion film; and
a through electrode that penetrates the semiconductor substrate to transfer an electric charge, converted through photoelectric conversion of the organic photoelectric conversion film, to the side of the other of the surfaces of the semiconductor substrate,
wherein the lower electrode and the through electrode are connected.

3. The back-illuminated solid-state imaging device of claim 1, further comprising:
a lower electrode provided under the organic photoelectric conversion film;
a through electrode adapted to penetrate the semiconductor substrate to transfer an electric charge, converted through photoelectric conversion of the organic photoelectric conversion film, to the side of the other of the surfaces of the semiconductor substrate; and
at least an interconnect layer adapted to connect the lower electrode and the through electrode.

4. The back-illuminated solid-state imaging device of claim 1, wherein the optical waveguide and the first insulating film are perpendicularly separated.

5. The back-illuminated solid-state imaging device of claim 1, wherein the optical waveguide has a refractive index greater than the first insulating film.

6. The back-illuminated solid-state imaging device of claim 1, wherein
the optical waveguide includes SiN and has a refractive index of 1.8 to 2.1, and
the first insulating film includes SiO and has a refractive index of 1.3 to 1.5.

7. The back-illuminated solid-state imaging device of claim 1, wherein the optical waveguide includes a low-dielectric constant material.

8. The back-illuminated solid-state imaging device of claim 1, wherein the thickness from the semiconductor substrate to the organic photoelectric conversion film is 1 μm or less.

9. The back-illuminated solid-state imaging device of claim 1, wherein the optical waveguide includes an organic film.

10. The back-illuminated solid-state imaging device of claim 1, further comprising:
a second insulating film formed under the optical waveguide.

11. The back-illuminated solid-state imaging device of claim 1, further comprising:
a low-dielectric-constant material layer formed under the optical waveguide.

12. The back-illuminated solid-state imaging device of claim 1, further comprising:
an inner lens formed between the organic photoelectric conversion film and the optical waveguide.

13. The back-illuminated solid-state imaging device of claim 1, further comprising:
a first lower electrode;
a second lower electrode connected to the first lower electrode and formed at a lower position than the first lower electrode;
a via adapted to connect the first lower electrode and the second lower electrode; and
a photodiode formed at a lower position than the second lower electrode,
wherein a first distance between the center of the photodiode and the center of the via at a view angle center and a second distance between the center of the photodiode and the center of the via at a view angle end are different.

14. An electronic apparatus incorporating a back-illuminated solid-state imaging device, the back-illuminated solid-state imaging device including at least
a semiconductor substrate,
an organic photoelectric conversion film formed on one surface of the semiconductor substrate,
an optical waveguide formed between the semiconductor substrate and the organic photoelectric conversion film, and
a first insulating film formed between the semiconductor substrate and the organic photoelectric conversion film and extending beyond a length of the optical waveguide in a vertical direction from the organic photoelectric conversion film towards the semiconductor substrate.

* * * * *